United States Patent
Manchana et al.

(10) Patent No.: US 11,244,895 B2
(45) Date of Patent: Feb. 8, 2022

(54) INTERTWINED WELL CONNECTION AND DECOUPLING CAPACITOR LAYOUT STRUCTURE FOR INTEGRATED CIRCUITS

(71) Applicant: QUALCOMM Incorporated, San Diego, CA (US)

(72) Inventors: Ramesh Manchana, Hyderabad (IN); Sudheer Chowdary Gali, Bangalore (IN); Biswa Ranjan Panda, Bangaluru (IN); Dhaval Sejpal, San Diego, CA (US); Stanley Seungchul Song, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 16/889,645

(22) Filed: Jun. 1, 2020

(65) Prior Publication Data

US 2021/0375747 A1    Dec. 2, 2021

(51) Int. Cl.
| | |
|---|---|
| *H01L 23/522* | (2006.01) |
| *H01L 23/528* | (2006.01) |
| *H01L 27/06* | (2006.01) |
| *H01L 29/78* | (2006.01) |
| *H01L 29/06* | (2006.01) |

(Continued)

(52) U.S. Cl.
CPC ...... *H01L 23/5223* (2013.01); *H01L 23/5286* (2013.01); *H01L 27/0629* (2013.01); *H01L 28/86* (2013.01); *H01L 29/0623* (2013.01); *H01L 29/1083* (2013.01); *H01L 29/1087* (2013.01); *H01L 29/7851* (2013.01)

(58) Field of Classification Search
CPC ............ H01L 23/5223; H01L 23/5286; H01L 27/0629; H01L 28/86; H01L 29/0623; H01L 29/1083; H01L 29/1087; H01L 29/7851
USPC .......................................................... 257/379
See application file for complete search history.

(56) References Cited

U.S. PATENT DOCUMENTS

| | | |
|---|---|---|
| 6,608,365 B1 | 8/2003 | Li et al. |
| 7,508,696 B2 | 3/2009 | Komaki |

(Continued)

FOREIGN PATENT DOCUMENTS

| | | |
|---|---|---|
| CN | 103247697 A | 8/2013 |
| GB | 2348556 A | 10/2000 |

(Continued)

*Primary Examiner* — Dzung Tran
(74) *Attorney, Agent, or Firm* — Procopio, Cory, Hargreaves & Savitch LLP

(57) ABSTRACT

A substrate tie cell on an IC is provided. The substrate tie cell includes a diffusion region. The diffusion region is a p-type diffusion region on or within a p-type substrate, an n-type diffusion region on or within an n-type well within a p-type substrate, an n-type diffusion region on or within an n-type substrate, or a p-type diffusion region on or within a p-type well within an n-type substrate. The substrate tie cell further includes a plurality of adjacent gate interconnects (n adjacent gate interconnects) extending over the diffusion region, where n≥4. The diffusion region is configured to be at one of a first voltage or a second voltage, and the gate interconnects are configured to be at an other of the first voltage or the second voltage. In one configuration, the first voltage is a power supply voltage and the second voltage is a ground voltage.

18 Claims, 23 Drawing Sheets

(51) Int. Cl.
*H01L 29/10* (2006.01)
*H01L 49/02* (2006.01)

(56) References Cited

U.S. PATENT DOCUMENTS

| | | |
|---|---|---|
| 7,750,511 B2 | 7/2010 | Agarwal et al. |
| 8,134,824 B2 | 3/2012 | Frederick et al. |
| 8,188,516 B2 | 5/2012 | Correale, Jr. et al. |
| 8,227,846 B2 | 7/2012 | Carlson |
| 8,461,920 B2 | 6/2013 | Nakanishi |
| 9,082,886 B2 | 7/2015 | Chen et al. |
| 9,438,225 B1 | 9/2016 | Yeung et al. |
| 10,032,763 B2 | 7/2018 | Kumar et al. |
| 2006/0237726 A1 | 10/2006 | Iwamatsu et al. |
| 2007/0045770 A1 | 3/2007 | Aoki |
| 2007/0205451 A1* | 9/2007 | Mizushino ........ H01L 27/11807 257/300 |
| 2007/0252217 A1 | 11/2007 | Oki |
| 2009/0034658 A1 | 2/2009 | Lu et al. |
| 2009/0212853 A1 | 8/2009 | Kim et al. |
| 2009/0243658 A1 | 10/2009 | Yokoi et al. |
| 2012/0256680 A1* | 10/2012 | Nakanishi ........... H01L 23/5286 327/534 |
| 2014/0225114 A1* | 8/2014 | Furukawa ........... H01L 27/0296 257/48 |
| 2017/0229457 A1* | 8/2017 | Maeno ................ H01L 27/0738 |
| 2019/0012419 A1 | 1/2019 | Kong |

FOREIGN PATENT DOCUMENTS

| | | |
|---|---|---|
| JP | 2005167039 A | 6/2005 |
| JP | 2006303377 A | 11/2006 |
| JP | 2007067207 A | 3/2007 |
| JP | 2008263185 A | 10/2008 |
| JP | 2009246062 A | 10/2009 |
| KR | 20060085271 A | 7/2006 |

* cited by examiner

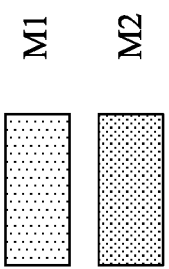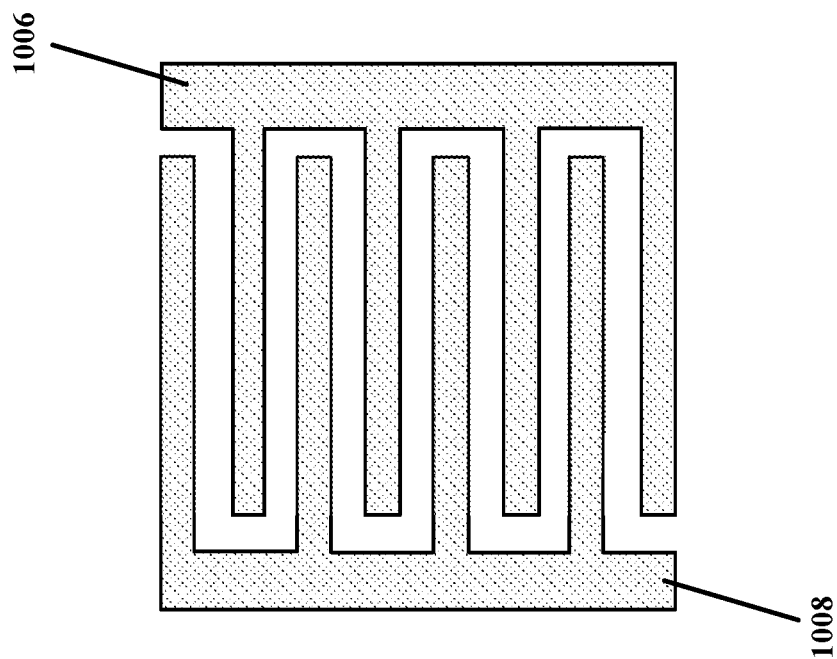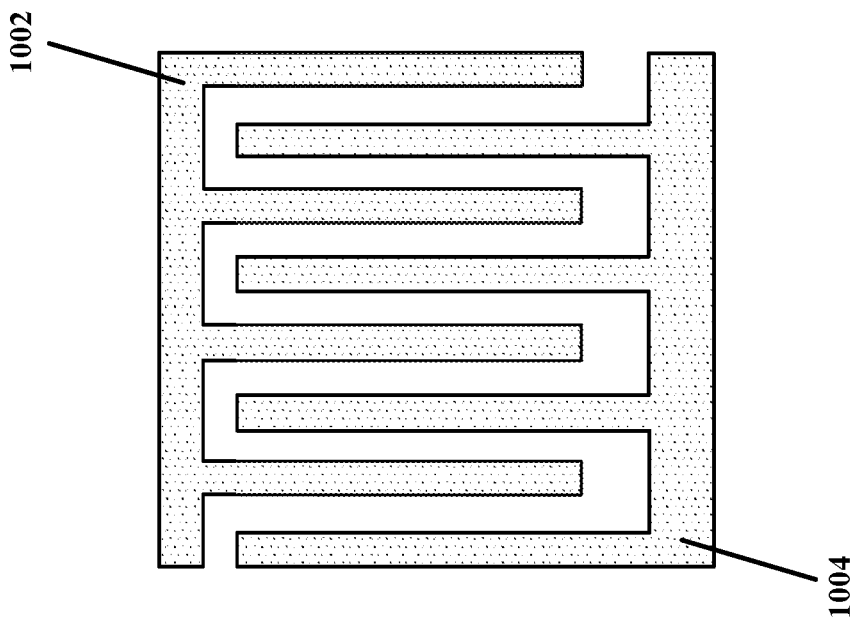
FIG. 10

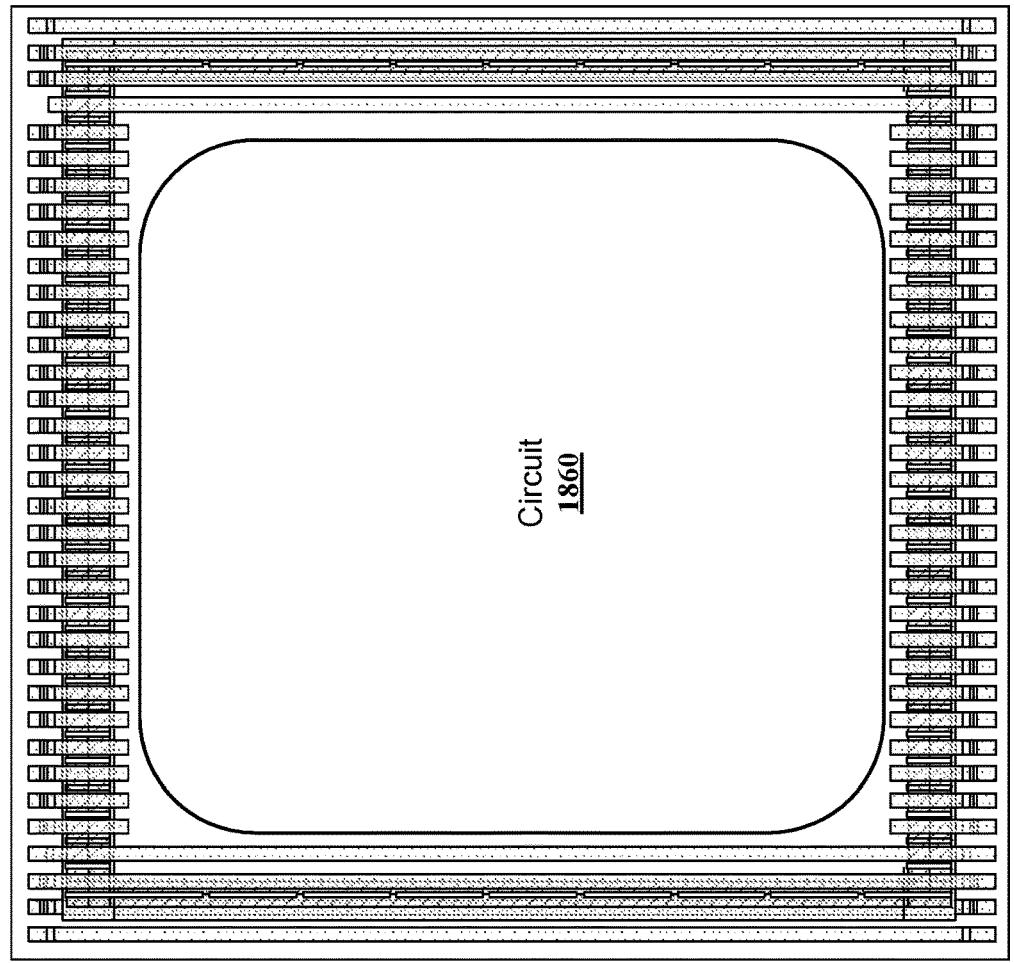
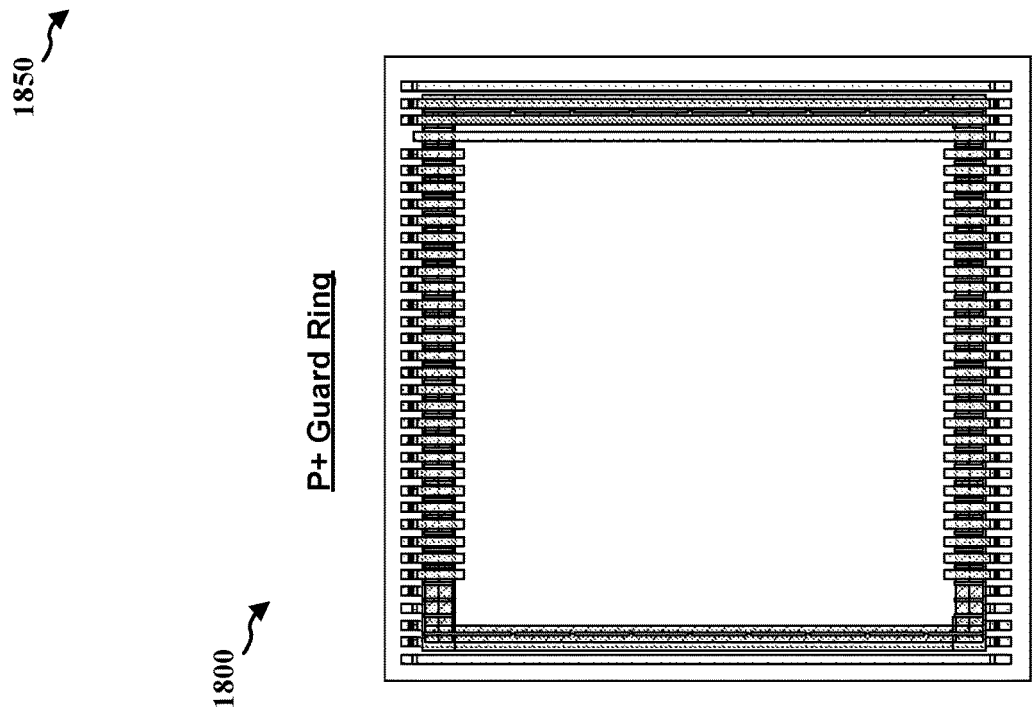
FIG. 18

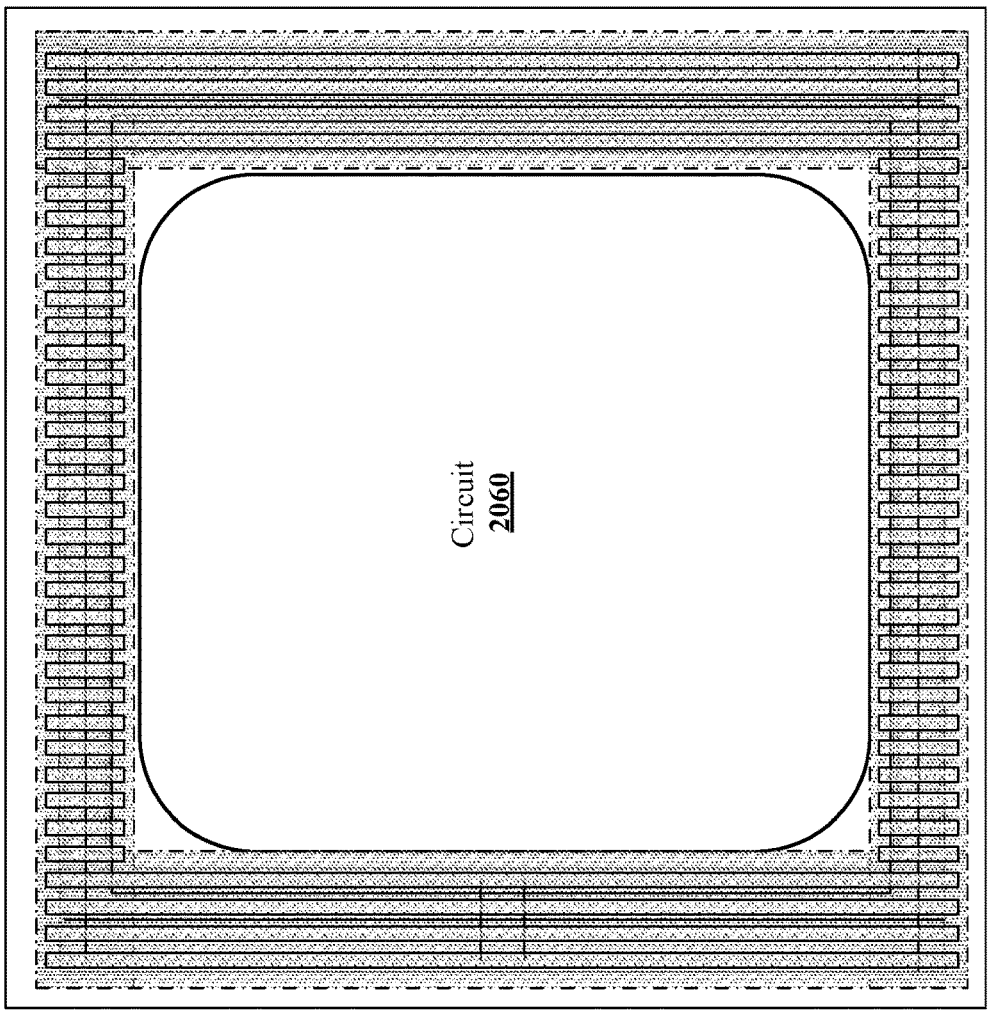
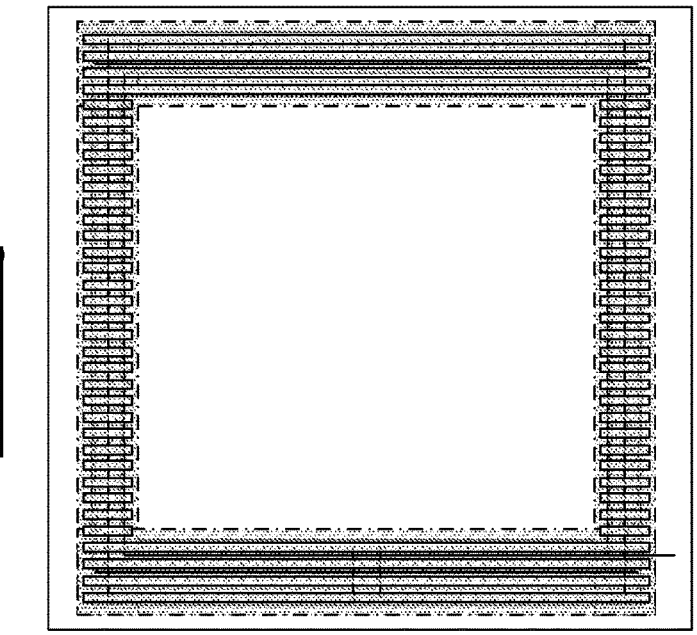
FIG. 20

US 11,244,895 B2

INTERTWINED WELL CONNECTION AND DECOUPLING CAPACITOR LAYOUT STRUCTURE FOR INTEGRATED CIRCUITS

BACKGROUND

Field

The present disclosure relates generally to a cell architecture, and more particularly, to an intertwined well connection and decoupling capacitor layout structure for integrated circuits.

Background

A standard cell device is an integrated circuit (IC) that implements digital logic. Such standard cell device may be reused multiple times within an application-specific IC (ASIC). An ASIC, such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or fin FETs (FinFETs)) and connect the transistors into circuits.

A substrate tie cell ties the substrate of an IC to power/ground. There is currently a need for improved substrate tie cells with improved performance with respect to a provided decoupling capacitance.

SUMMARY

In an aspect of the disclosure, a substrate tie cell on an IC is provided. The substrate tie cell includes a diffusion region. The diffusion region is a p-type diffusion region on or within a p-type substrate, an n-type diffusion region on or within an n-type well within a p-type substrate, an n-type diffusion region on or within an n-type substrate, or a p-type diffusion region on or within a p-type well within an n-type substrate. The substrate tie cell further includes a plurality of adjacent gate interconnects extending over the diffusion region, where the plurality of adjacent gate interconnects includes n gate interconnects and n≥4. The diffusion region is configured to be at one of a first voltage or a second voltage, and the gate interconnects are configured to be at an other of the first voltage or the second voltage.

In an aspect of the disclosure, an IC is provided. The IC includes a first set of substrate tie cells on the IC. The first set of substrate tie cells form a first ring on the IC. The substrate tie cells of the first set of substrate tie cells are a first type of substrate tie cell. Each substrate tie cell of the first set of substrate tie cells includes a diffusion region. The diffusion region is a p-type diffusion region on or within a p-type substrate, an n-type diffusion region on or within an n-type well within a p-type substrate, an n-type diffusion region on or within an n-type substrate, or a p-type diffusion region on or within a p-type well within an n-type substrate. Each substrate tie cell of the first set of substrate tie cells further includes at least one gate interconnect extending over the diffusion region. The diffusion region is configured to be at one of a first voltage or a second voltage, and the at least one gate interconnect is configured to be at an other of the first voltage or the second voltage.

BRIEF DESCRIPTION OF THE DRAWINGS

FIG. 10 is a diagram illustrating a top-view of a metal layer 1 (M1) and metal layer 2 (M2) comb structure of a substrate tie cell.

FIG. 18 is a first set of diagrams illustrating a top-view of a layout for a p-type guard ring formed of adjacent p-type substrate tie cells.

FIG. 20 is a first set of diagrams illustrating a top-view of a layout for an n-type guard ring formed of adjacent n-type substrate tie cells.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
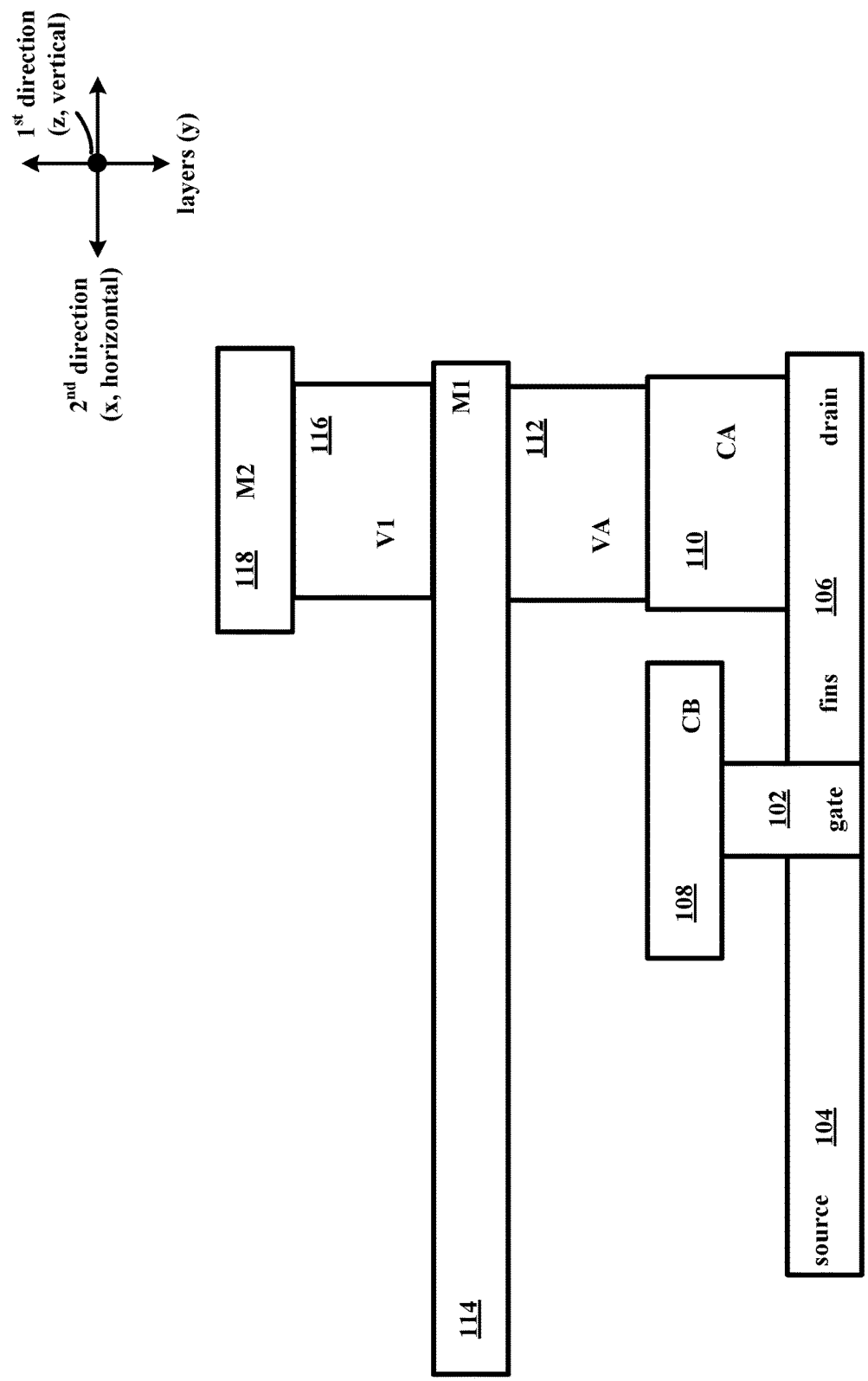
FIG. 1 is a first diagram illustrating a side view of various layers within a standard cell and IC.

FIG. 1 is a first diagram 100 illustrating a side view of various layers within a standard cell and IC. The various layers change in the y direction. As illustrated in FIG. 1, a transistor has a gate 102 (which may be referred to as POLY even though the gate may be formed of metal, polysilicon, or a combination of polysilicon and metal), a source 104, and a drain 106. The source 104 and the drain 106 may be formed by fins. The gate 102 may extend in a first direction (e.g., vertical direction along the z axis coming out of the page), and the fins may extend in a second direction orthogonal to the first direction (e.g., horizontal direction along the x axis). A contact B (CB) layer interconnect 108 (also referred to as a metal POLY (MP) layer interconnect) may contact the gate 102. A contact A (CA) layer interconnect 110 (also referred to as a metal diffusion (MD) layer interconnect) may contact the source 104 and/or the drain 106. A via 112 (which may be referred to as via A (VA)) may contact the CA layer interconnect 110. A metal 1 (M1) layer interconnect 114 may contact the via VA 112. The M1 layer interconnect 114 may extend in the second direction only (i.e., unidirectional in the second direction). A via V1 116 may contact the M1 layer interconnect 114. A metal 2 (M2) layer interconnect 118 may contact the via V1 116. The M2 layer interconnect 118 may extend in the first direction only (i.e., unidirectional in the first direction). The M2 layer is a lowest vertical layer. Specifically, the M2 layer may be unidirectional in the vertical direction, and is the closest vertically unidirectional layer to the silicon substrate. Higher layers include a via layer including vias V2 and a metal 3 (M3) layer including M3 layer interconnects. The M3 layer interconnects may extend in the second direction.

Figure 2:
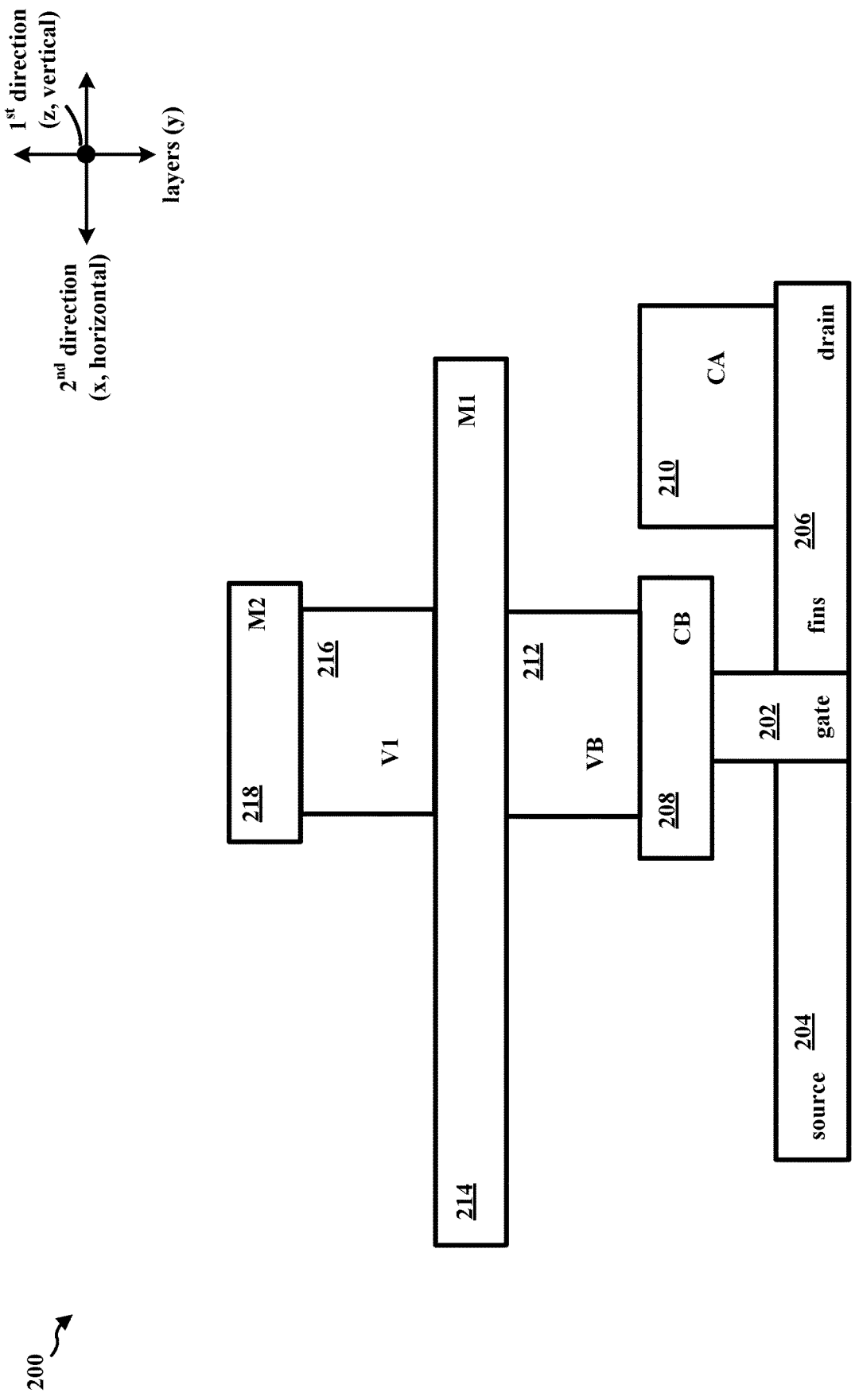
FIG. 2 is a second diagram illustrating a side view of various layers within a standard cell and IC.

FIG. 2 is a second diagram 200 illustrating a side view of various layers within a standard cell and IC. The various layers change in the y direction. As illustrated in FIG. 2, a transistor has a gate 202, a source 204, and a drain 206. The source 204 and the drain 206 may be formed by fins. The gate 202 may extend in a first direction (e.g., vertical direction along the z axis coming out of the page), and the fins may extend in a second direction orthogonal to the first direction (e.g., horizontal direction along the x axis). A CB layer interconnect 208 may contact the gate 202. A CA layer interconnect 210 may contact the source 204 and/or the drain 206. A via 212 (which may be referred to as via B (VB)) may contact the CB layer interconnect 208. An M1 layer interconnect 214 may contact the via VB 212. The M1 layer interconnect 214 may extend in the second direction only (i.e., unidirectional in the second direction). A via V1 216 may contact the M1 layer interconnect 214. An M2 layer interconnect 218 may contact the via V1 216. The M2 layer interconnect 218 may extend in the first direction only (i.e., unidirectional in the first direction). The M2 layer is a lowest vertical layer. Specifically, the M2 layer may be unidirectional in the vertical direction, and is the closest vertically unidirectional layer to the silicon substrate. Higher layers include a via layer including vias V2 and an M3 layer including M3 layer interconnects. The M3 layer interconnects may extend in the second direction.

Decoupling capacitors may be used in ICs to remove high frequency noise in the power grid, where the high frequency noise is injected by high speed switching circuits. Such decoupling capacitors stabilize the power grid. Decoupling capacitors may also be used in ICs to overcome the issue of dynamic IR (voltage) drop caused by a surge current drawn from the power pads by a group of cells placed together and switching simultaneously. Decoupling capacitors connected between power and ground may be located close to the group of cells in order to provide the surge current to the group of cells. Such decoupling capacitors decrease the dynamic IR drop. In high speed circuits, decoupling capacitors may be located far away from the circuitry, as a decoupling capacitance may not be considered as a core part of the IC design for such high speed circuits. Locating the decoupling capacitors far away from the circuitry can dilute the impact of the decoupling capacitance. The amount decoupling capacitance provided in an IC may be limited by the "white space" available after the core design is laid out. Hence, there is a trade-off between IC area and performance with respect to a decoupling capacitance. Typically, large decoupling capacitors providing a large decoupling capacitance are located far away from the core circuit in an IC. Such approach increases the area of the IC, and also dilutes the purpose of the decoupling capacitance.

A layout structure for a substrate tie cell that provides a decoupling capacitance is provided infra. The proposed layout structure introduces a plurality of gate connections, where the gate is connected either to a power supply voltage or to a ground voltage. The structure can be integrated into the layout of the core circuit, making the provided decoupling capacitance more effective than the traditional decoupling capacitance, as discussed supra. With the proposed layout structure, a large amount of decoupling capacitance can be achieved with less overall increase in area of the IC.

Figure 3:
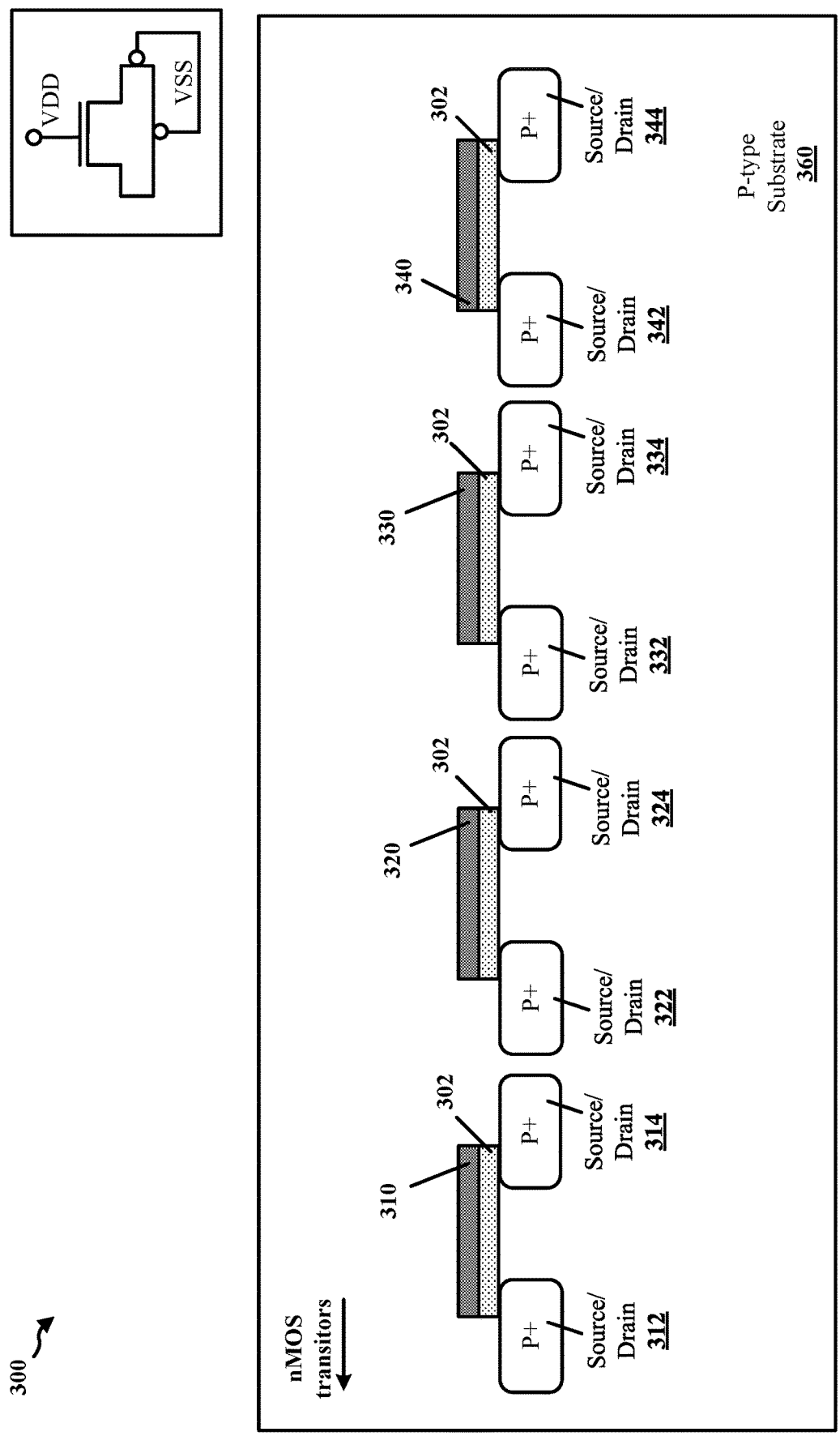
FIG. 3 is a diagram conceptually illustrating a substrate tie cell with a p-type diffusion region on or within a p-type substrate.

FIG. 3 is a diagram 300 conceptually illustrating a substrate tie cell with a p-type diffusion region on or within a p-type substrate. The substrate tie cell includes a p-type substrate 360. Within or on the p-type substrate 360 are a plurality of p-type diffusion regions (also referred to as source/drain) 312, 314, 322, 324, 332, 334, 342, 344. The p-type diffusion regions 312, 314, 322, 324, 332, 334, 342, 344 may be formed from fins on the surface of the p-type substrate 360. Gate interconnects 310, 320, 330, 340 may extend over respective p-type diffusions regions 312, 314, 322, 324, 332, 334, 342, 344 with a thin oxide 302 therebetween. The diagram illustrates the gate interconnect 310 extending over the p-type diffusion regions 312, 314; the gate interconnect 320 extending over the p-type diffusion regions 322, 324; the gate interconnect 330 extending over the p-type diffusion regions 332, 334; and the gate interconnect 340 extending over the p-type diffusion regions 342, 344. Each of the p-type diffusions regions 312, 314, 322, 324, 332, 334, 342, 344 may be connected to a ground voltage Vss. Each of the gate interconnects 310, 320, 330, 340 may be connected to a power supply voltage Vdd.

Connecting the four adjacent gate interconnects 310, 320, 330, 340 to a power supply voltage Vdd while the p-type diffusion regions 312, 314, 322, 324, 332, 334, 342, 344 are connected to a ground voltage Vss provide the substrate tie cell with a decoupling capacitance. The configuration allows the substrate tie cell to provide a decoupling capacitance to the IC while tying the p-type substrate 360 to the ground voltage Vss and providing a body connection at the ground voltage Vss to n-type MOS (nMOS) transistors within or on the p-type substrate 360 outside the substrate tie cell.

Figure 4:
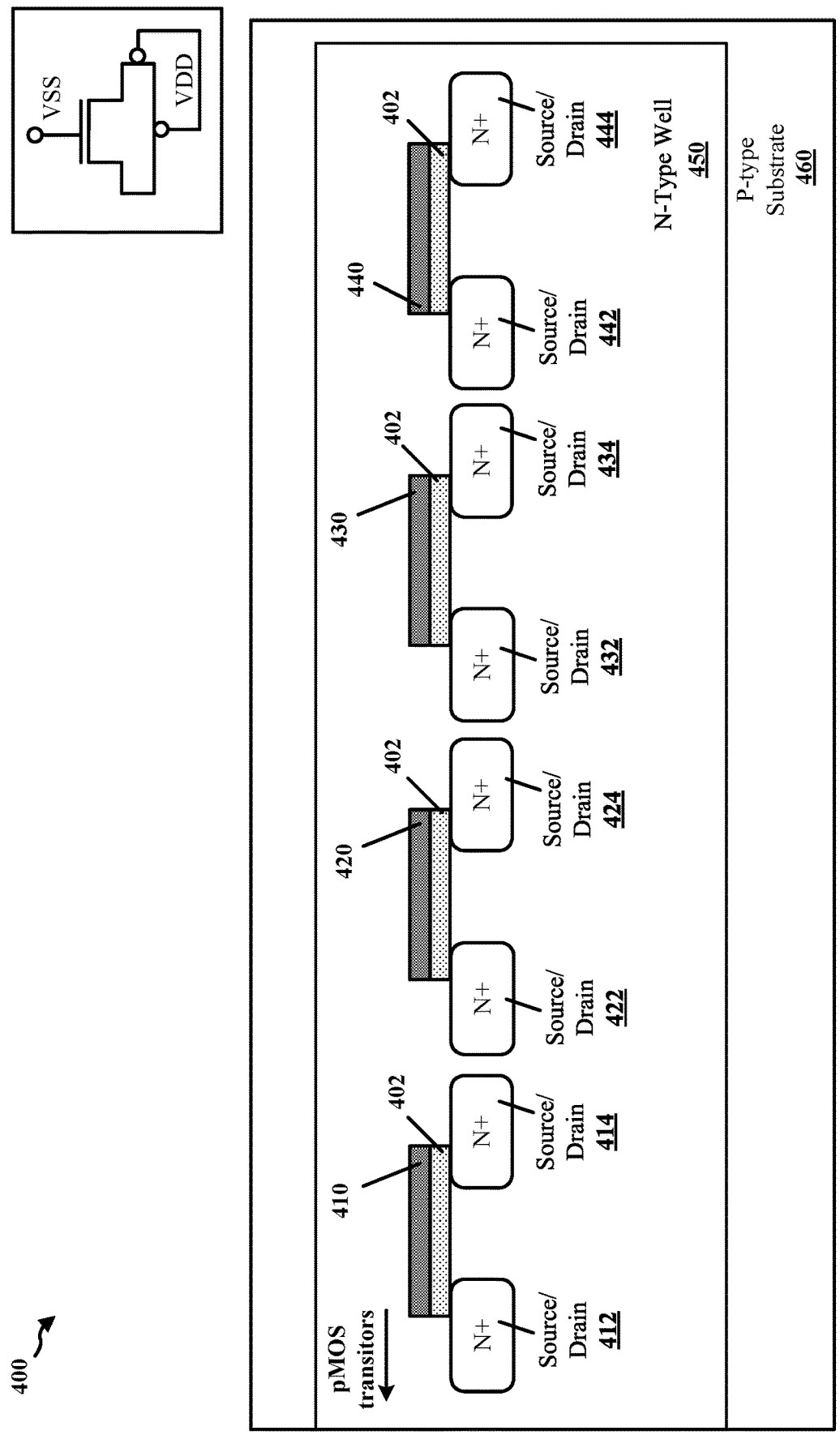
FIG. 4 is a diagram conceptually illustrating a substrate tie cell with an n-type diffusion region on or within an n-type well within a p-type substrate.

FIG. 4 is a diagram 400 conceptually illustrating a substrate tie cell with an n-type diffusion region on or within an n-type well within a p-type substrate. The substrate tie cell includes a p-type substrate 460. Within the p-type substrate 460 is an n-type well 450. Within or on the n-type well 450 are a plurality of n-type diffusion regions (also referred to as source/drain) 412, 414, 422, 424, 432, 434, 442, 444. The n-type diffusion regions 412, 414, 422, 424, 432, 434, 442, 444 may be formed from fins on the surface of the n-type well 450. Gate interconnects 410, 420, 430, 440 may extend over respective n-type diffusions regions 412, 414, 422, 424, 432, 434, 442, 444 with a thin oxide 402 therebetween. The diagram illustrates the gate interconnect 410 extending over the n-type diffusion regions 412, 414; the gate interconnect 420 extending over the n-type diffusion regions 422, 424; the gate interconnect 430 extending over the n-type diffusion regions 432, 434; and the gate interconnect 440 extending over the n-type diffusion regions 442, 444. Each of the n-type diffusions regions 412, 414, 422, 424, 432, 434, 442, 444 may be connected to a power supply voltage Vdd. Each of the gate interconnects 410, 420, 430, 440 may be connected to a ground voltage Vss. Connecting the four adjacent gate interconnects 410, 420, 430, 440 to a ground voltage Vss while the n-type diffusion regions 412, 414, 422, 424, 432, 434, 442, 444 are connected to a power supply voltage Vdd provide the substrate tie cell with a decoupling capacitance. The configuration allows the substrate tie cell to provide a decoupling capacitance to the IC while tying the n-type well 450 to the power supply voltage Vdd and providing a body connection at the power supply voltage Vdd to p-type MOS (pMOS) transistors within or on the n-type well 450 outside the substrate tie cell.

Figure 5:
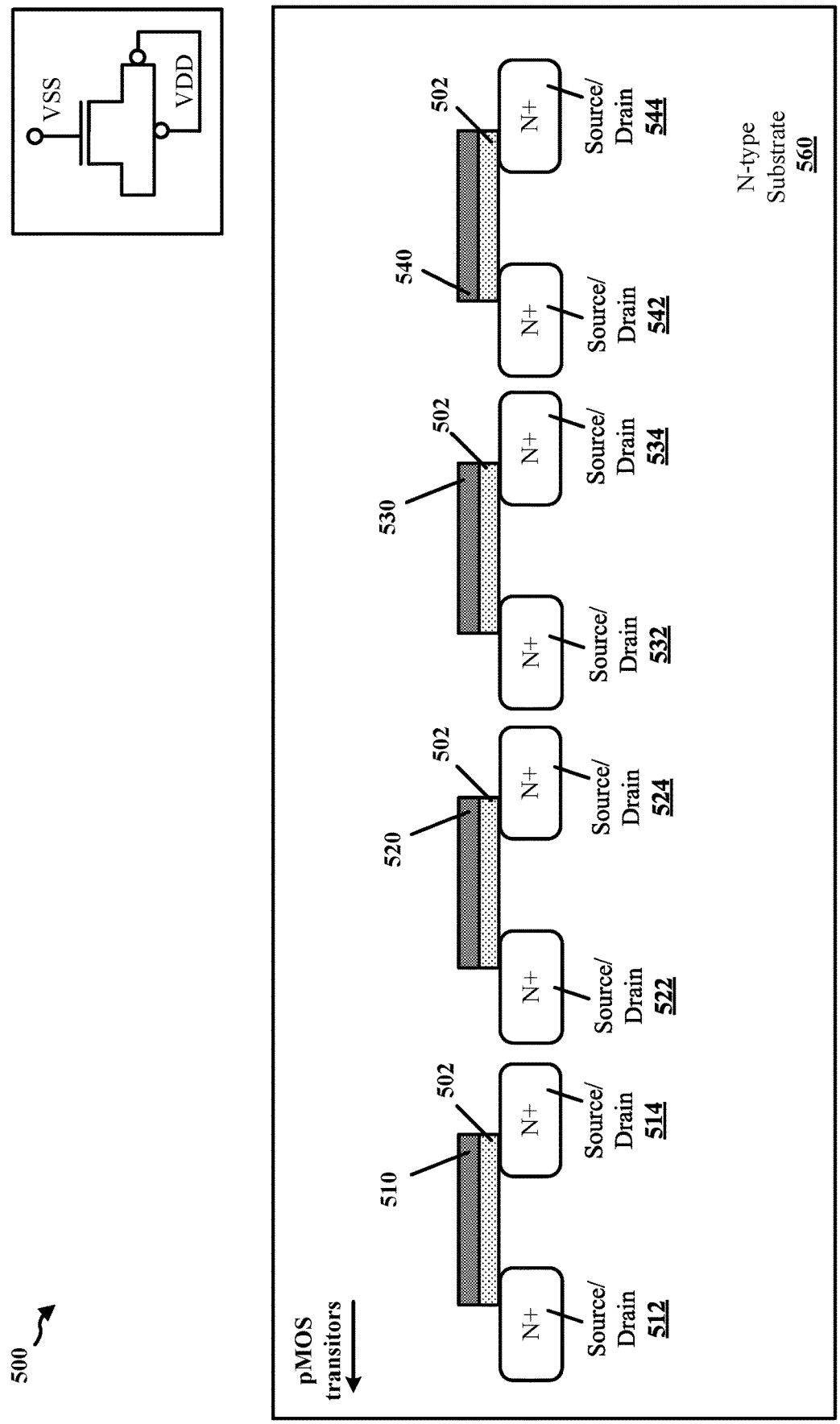
FIG. 5 is a diagram conceptually illustrating a substrate tie cell with an n-type diffusion region on or within an n-type substrate.

FIG. 5 is a diagram 500 conceptually illustrating a substrate tie cell with an n-type diffusion region on or within an n-type substrate. The substrate tie cell includes an n-type substrate 560. Within the n-type substrate 560 are a plurality of n-type diffusion regions (also referred to as source/drain) 512, 514, 522, 524, 532, 534, 542, 544. The n-type diffusion regions 512, 514, 522, 524, 532, 534, 542, 544 may be formed from fins on the surface of the n-type substrate 560. Gate interconnects 510, 520, 530, 540 may extend over respective n-type diffusions regions 512, 514, 522, 524, 532, 534, 542, 544 with a thin oxide 502 therebetween. The diagram illustrates the gate interconnect 510 extending over the n-type diffusion regions 512, 514; the gate interconnect 520 extending over the n-type diffusion regions 522, 524; the gate interconnect 530 extending over the n-type diffusion regions 532, 534; and the gate interconnect 540 extending over the n-type diffusion regions 542, 544. Each of the n-type diffusions regions 512, 514, 522, 524, 532, 534, 542, 544 may be connected to a power supply voltage Vdd. Each of the gate interconnects 510, 520, 530, 540 may be connected to a ground voltage Vss. Connecting the four adjacent gate interconnects 510, 520, 530, 540 to a ground voltage Vss while the n-type diffusion regions 512, 514, 522, 524, 532, 534, 542, 544 are connected to a power supply voltage Vdd provide the substrate tie cell with a decoupling capacitance. The configuration allows the substrate tie cell to provide a decoupling capacitance to the IC while tying the n-type substrate 560 to the power supply voltage Vdd and providing a body connection at the power supply voltage Vdd to pMOS transistors within or on the n-type substrate 560 outside the substrate tie cell.

Figure 6:
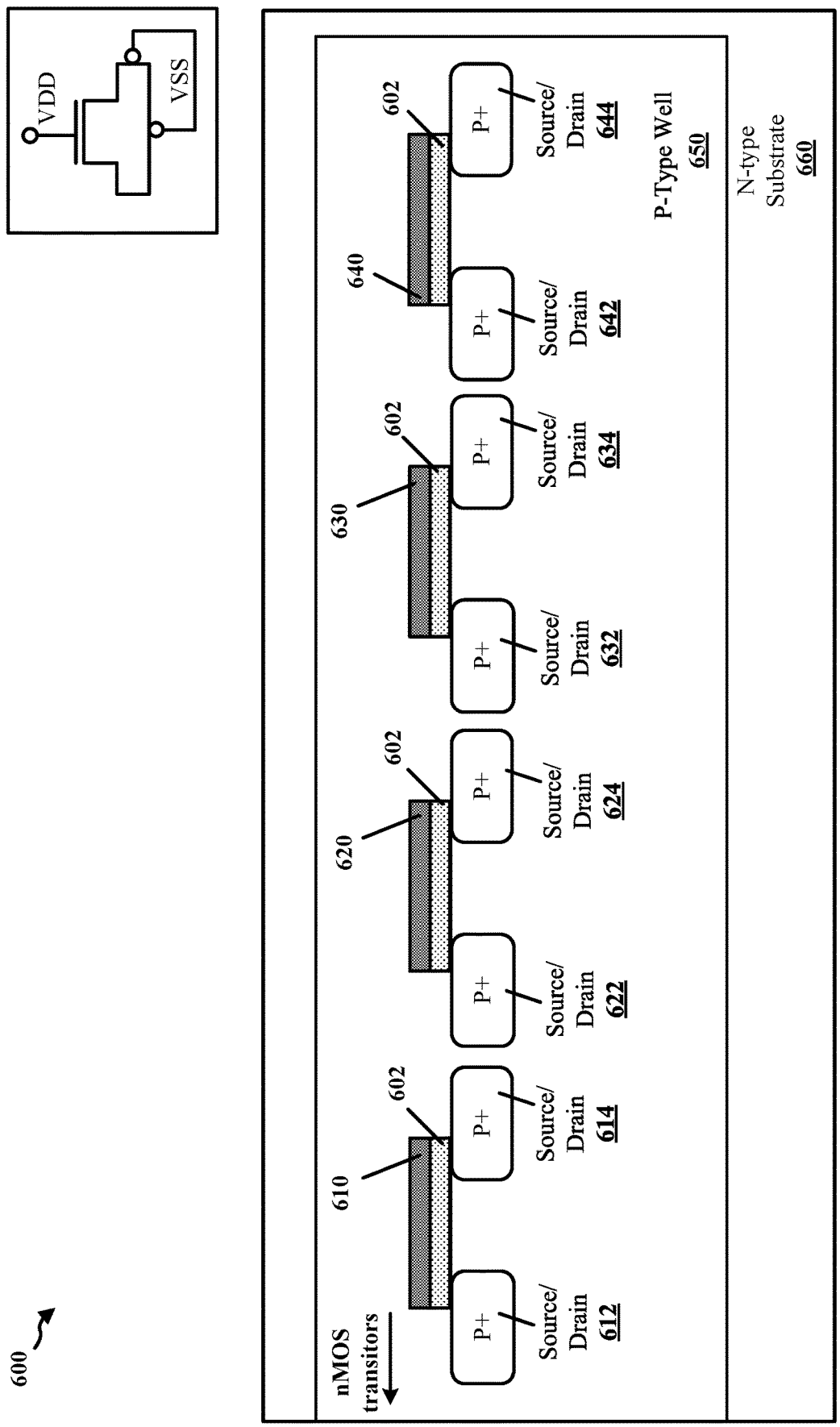
FIG. 6 is a diagram conceptually illustrating a substrate tie cell with a p-type diffusion region on or within a p-type well within an n-type substrate.

FIG. 6 is a diagram 600 conceptually illustrating a substrate tie cell with a p-type diffusion region on or within a p-type well within an n-type substrate. The substrate tie cell includes an n-type substrate 660. Within the n-type substrate 660 is a p-type well 650. Within or on the p-type well 650 are a plurality of p-type diffusion regions (also referred to as source/drain) 612, 614, 622, 624, 632, 634, 642, 644. The p-type diffusion regions 612, 614, 622, 624, 632, 634, 642, 644 may be formed from fins on the surface of the p-type well 650. Gate interconnects 610, 620, 630, 640 may extend over respective p-type diffusions regions 612, 614, 622, 624, 632, 634, 642, 644 with a thin oxide 602 therebetween. The diagram illustrates the gate interconnect 610 extending over the p-type diffusion regions 612, 614; the gate interconnect 620 extending over the p-type diffusion regions 622, 624; the gate interconnect 630 extending over the p-type diffusion regions 632, 634; and the gate interconnect 640 extending over the p-type diffusion regions 642, 644. Each of the p-type diffusions regions 612, 614, 622, 624, 632, 634, 642, 644 may be connected to a ground voltage Vss. Each of the gate interconnects 610, 620, 630, 640 may be connected to a power supply voltage Vdd. Connecting the four adjacent gate interconnects 610, 620, 630, 640 to a power supply voltage Vdd while the p-type diffusion regions 612, 614, 622, 624, 632, 634, 642, 644 are connected to a ground voltage Vss provide the substrate tie cell with a decoupling capacitance. The configuration allows the substrate tie cell to provide a decoupling capacitance to the IC while tying the p-type well 650 to the ground voltage Vss and providing a body connection at the ground voltage Vss to nMOS transistors within or on the p-type well 650 outside the substrate tie cell.

As discussed in relation to FIGS. 3-6, a substrate tie cell has a plurality of diffusion regions. As the plurality of diffusion regions are configured to be coupled to the same voltage, the plurality of diffusion regions may be referred to as one diffusion region. However, it should be understood that the one diffusion region includes separate diffusion sub-regions in the fins doped in the same way (p-type or n-type), where the diffusion sub-regions are separated by different doping (n-type or p-type, respectively) in the fins directly under the gate interconnects. Herein the diffusion sub-regions of a substrate tie cell will be referred to as a diffusion region.

Figure 7:
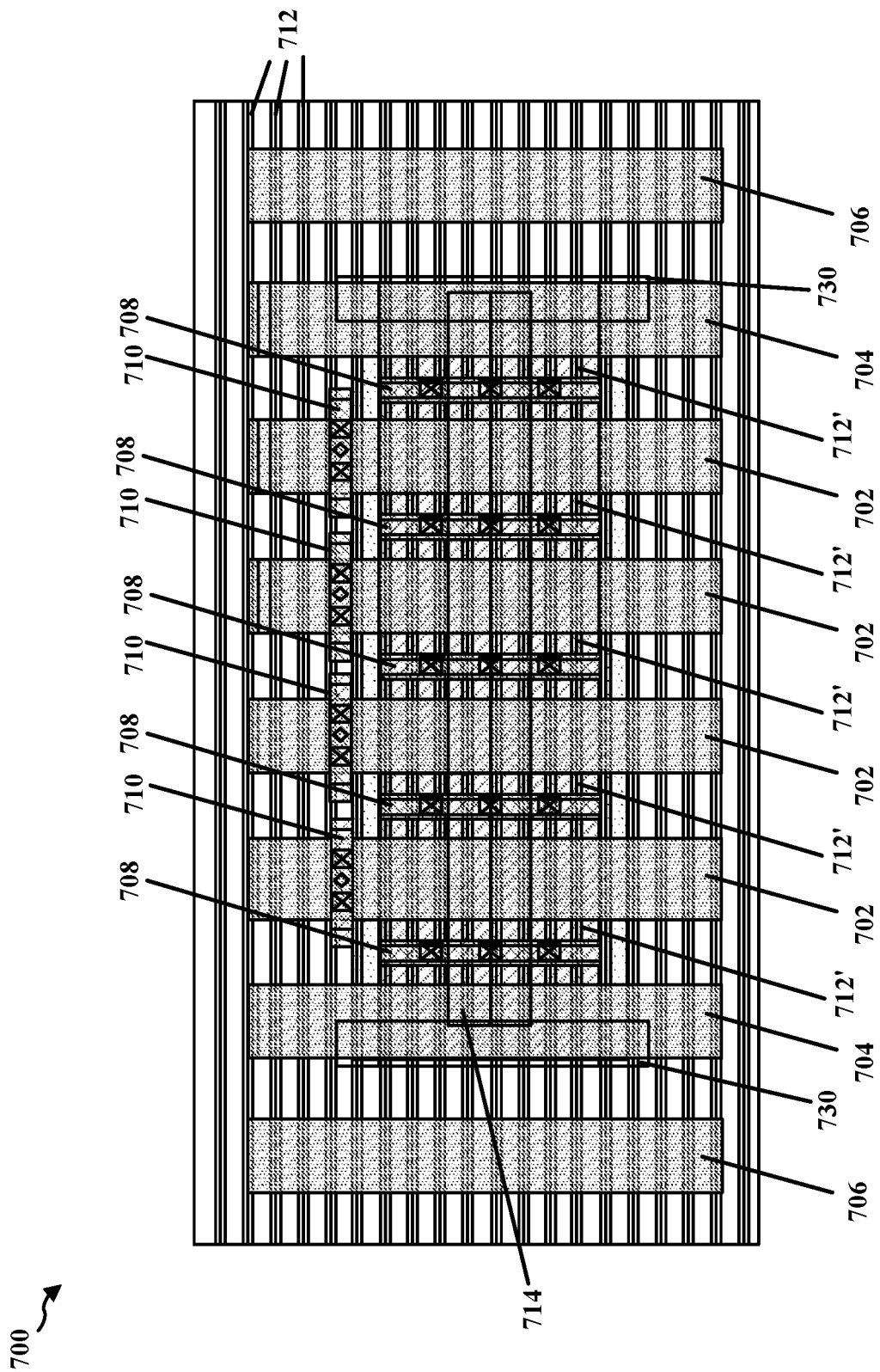
FIG. 7 is a diagram illustrating a top-view of a first layout of a substrate tie cell.

FIG. 7 is a diagram 700 illustrating a top-view of a first layout of a substrate tie cell. As illustrated in FIG. 7, the substrate tie cell includes a diffusion region 712' that is formed from fins 712 that extend horizontally across the cell. Fin cuts 730 cut the fins 712 in order to provide a diffusion region barrier with adjacent cells. The diffusion region 712' may be a p-type diffusion region on (or within) a p-type substrate (see FIG. 3) or an n-type diffusion region on (or within) an n-type substrate (see FIG. 5). Extending over the diffusion region 712' are a plurality of adjacent gate interconnects 702, where the plurality of adjacent gate interconnects includes n gate interconnects and n≥4. As illustrated in FIG. 7, n=4, as there are four adjacent gate interconnects 702 extending over the diffusion region 712'. The gate interconnects 704 are floating (not connected to a voltage) and are located at edges of the diffusion region 712'. In one configuration, the cell edge is located adjacent the fin cuts 730.

In another configuration, the edges regions of the cell may include additional floating gate interconnects. For example, the substrate tie cell may further include the gate interconnects 706, which as described are also floating and are located adjacent to the edges of the cell. The diffusion region 712' may be at a power supply voltage Vdd or a ground voltage Vss, with the power/ground connection fed through contacts CA and vias VA 708 (see FIG. 1) and M1 interconnect 714. The plurality of gate interconnects 702 are connected to power/ground through contacts CB and vias VB 710 (see FIG. 2). While the diffusion region 712' may be at a power supply voltage Vdd or a ground voltage Vss, the plurality of adjacent interconnects 702 may be at the ground voltage Vss or the power supply voltage Vdd, respectively. For example, if the diffusion region 712' is a p-type diffusion region, the p-type diffusion region 712' would be at the ground voltage Vss and the plurality of adjacent gate interconnects 702 would be at the power supply voltage Vdd (see FIG. 3); and if the diffusion region 712' is an n-type diffusion region, the n-type diffusion region 712' would be at the power supply voltage Vdd and the plurality of adjacent gate interconnects 702 would be at the ground voltage Vss (see FIG. 5).

Figure 8:
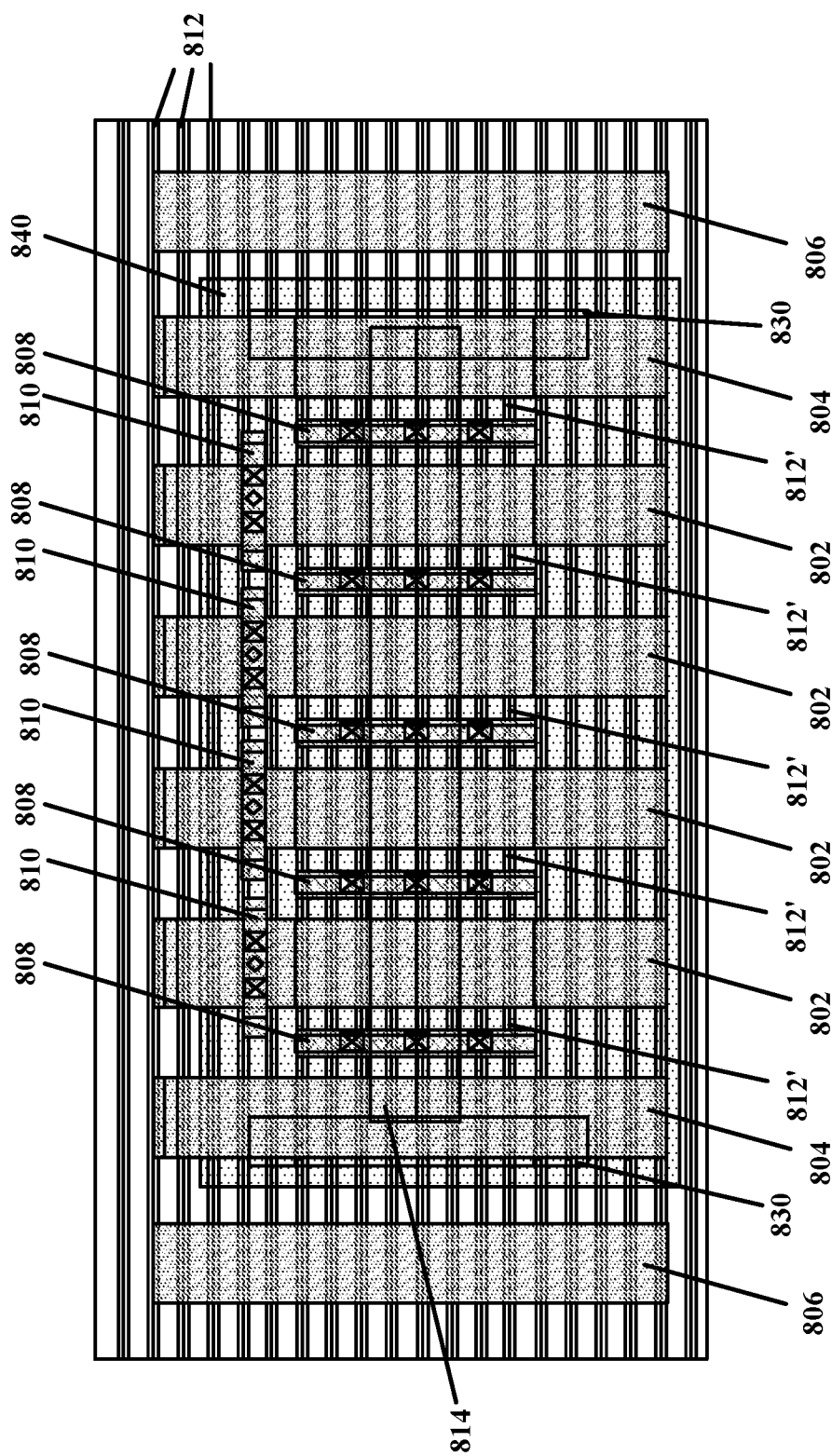
FIG. 8 is a diagram illustrating a top-view of a second layout of a substrate tie cell.

FIG. 8 is a diagram 800 illustrating a top-view of a second layout of a substrate tie cell. As illustrated in FIG. 8, the substrate tie cell includes a diffusion region 812' that is formed from fins 812 that extend horizontally across the cell. Fin cuts 830 cut the fins 812 in order to provide a diffusion region barrier with adjacent cells. The diffusion region 812' may be an n-type diffusion region on (or within) an n-type well 840 within a p-type substrate (see FIG. 4) or a p-type diffusion region on (or within) a p-type well 840 within an n-type substrate (see FIG. 6). Extending over the diffusion region 812' are a plurality of adjacent gate interconnects 802, where the plurality of adjacent gate interconnects includes n gate interconnects and n≥4. As illustrated in FIG. 8, n=4, as there are four adjacent gate interconnects 802 extending over the diffusion region 812'. The gate interconnects 804 are floating (not connected to a voltage) and are located at edges of the diffusion region 812'. The gate interconnects 806 are also floating and are located adjacent to the edges of the cell. The diffusion region 812' may be at a power supply voltage Vdd or a ground voltage Vss, with the power/ground connection fed through contacts CA and vias VA 808 (see FIG. 1) and M1 interconnect 814. The plurality of gate interconnects 802 are connected to power/ground through contacts CB and vias VB 810 (see FIG. 2). While the diffusion region 812' may be at a power supply voltage Vdd or a ground voltage Vss, the plurality of adjacent interconnects 802 may be at the ground voltage Vss or the power supply voltage Vdd, respectively. For example, if the diffusion region 812' is an n-type diffusion region, the n-type diffusion region 812' would be at the power supply voltage Vdd and the plurality of adjacent gate interconnects 802 would be at the ground voltage Vss (see FIG. 4); and if the diffusion region 812' is a p-type diffusion region, the p-type diffusion region 812' would be at the ground voltage Vss and the plurality of adjacent gate interconnects 802 would be at the power supply voltage Vdd (see FIG. 6).

Figure 9:
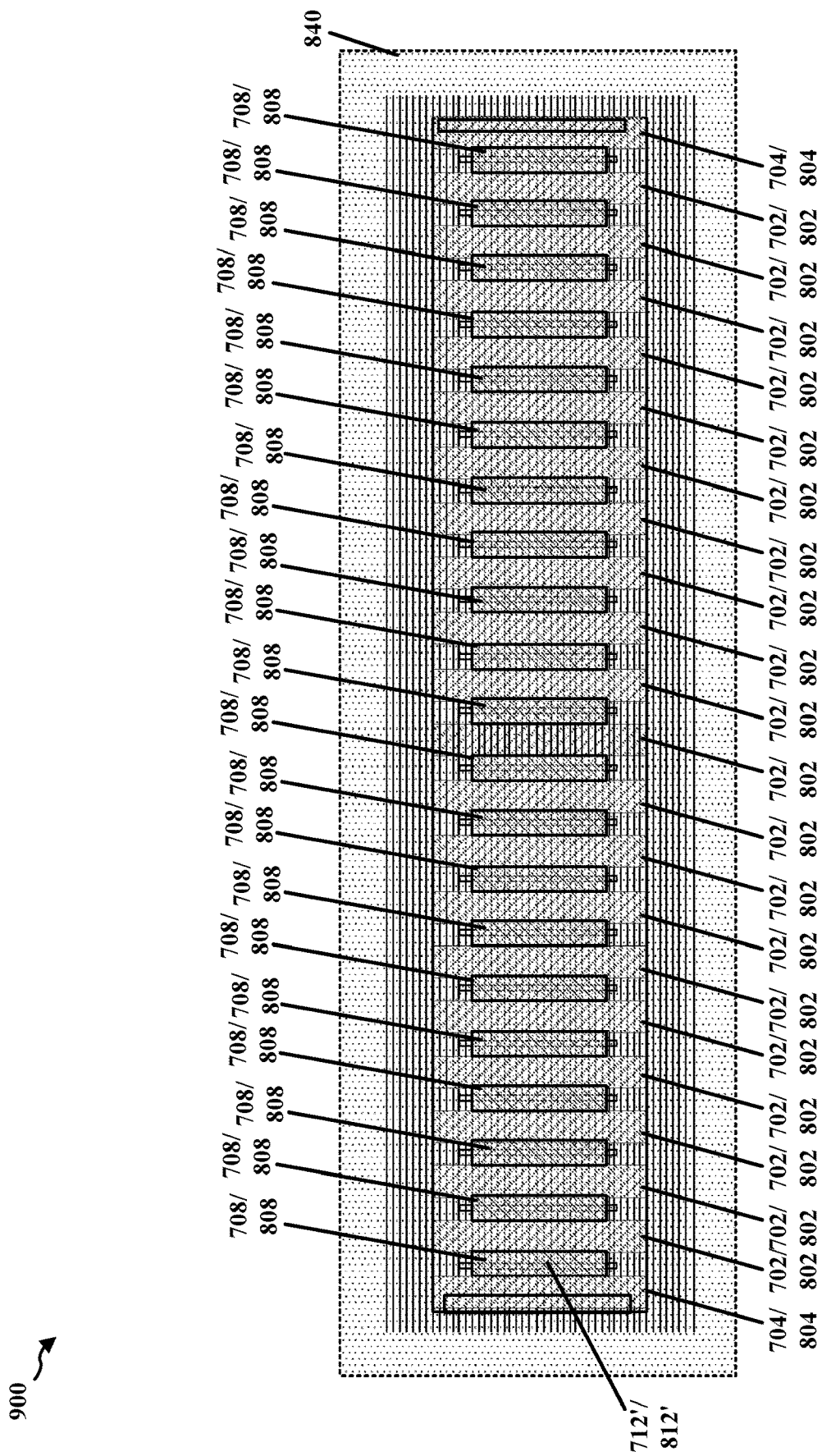
FIG. 9 is a diagram illustrating a top-view of a layout of the substrate tie cell.

FIG. 9 is a diagram 900 illustrating a top-view of a layout of the substrate tie cell. As illustrated in FIG. 9, the substrate tie cell may include a plurality of adjacent gate interconnects 702/802, where the plurality of adjacent gate interconnects includes n gate interconnects and n is much larger than four. For example, in FIG. 9, n=20. The gate interconnects 702/802 are connected to a power supply voltage Vdd or a ground voltage Vss. The diffusion region 712'/812' is connected to an opposite voltage through contacts/interconnects 708/808, either at the ground voltage Vss or the power supply voltage Vdd, respectively. The gate interconnects 704/804 are floating. In some examples, the diffusion region may be within a p-type or n-type well 840. In a first example, as illustrated in FIG. 3, there is no well 840, and the diffusion region 712'/812' is connected to a ground voltage Vss and the gate interconnects 702/802 are connected to a power supply voltage Vdd. In a second example, as illustrated in FIG. 4, there is an n-type well 840, and the diffusion region 712'/812' is connected to a power supply voltage Vdd and the gate interconnects 702/802 are connected to a ground voltage Vss. In a third example, as illustrated in FIG. 5, there is no well 840, and the diffusion region 712'/812' is connected to a power supply voltage Vdd and the gate interconnects 702/802 are connected to a ground voltage Vss. In a fourth example, as illustrated in FIG. 6, there is a p-type well 840, and the diffusion region 712'/812' is connected to a ground voltage Vss and the gate interconnects 702/802 are connected to a power supply voltage Vdd.

The aforedescribed substrate tie cell, with at least four adjacent interconnects tied to an opposite voltage to the diffusion region results in a minute increase in the area of the substrate tie cell (as a result of the additional gate contacts to the power supply voltage Vdd/ground voltage Vss) as compared to when all the gate interconnects are floating, but also provides a decoupling capacitance throughout the IC wherever the substrate tie cell is used. While the provided decoupling capacitance is relatively small compared to the typical decoupling capacitance provided by designed decoupling capacitors, an IC can include a fairly large number of substrate tie cells, and thus the overall provided decoupling capacitance can be relatively large, and may even allow for an overall decrease in area of the IC through less use of designed decoupling capacitors. As discussed infra, the aforedescribed substrate tie cell may further include overlapping metal comb structures (each metal comb structure including a plurality of parallel combs) that allow the substrate tie cell to provide an even larger decoupling capacitance.

Figures 11A, 11B:
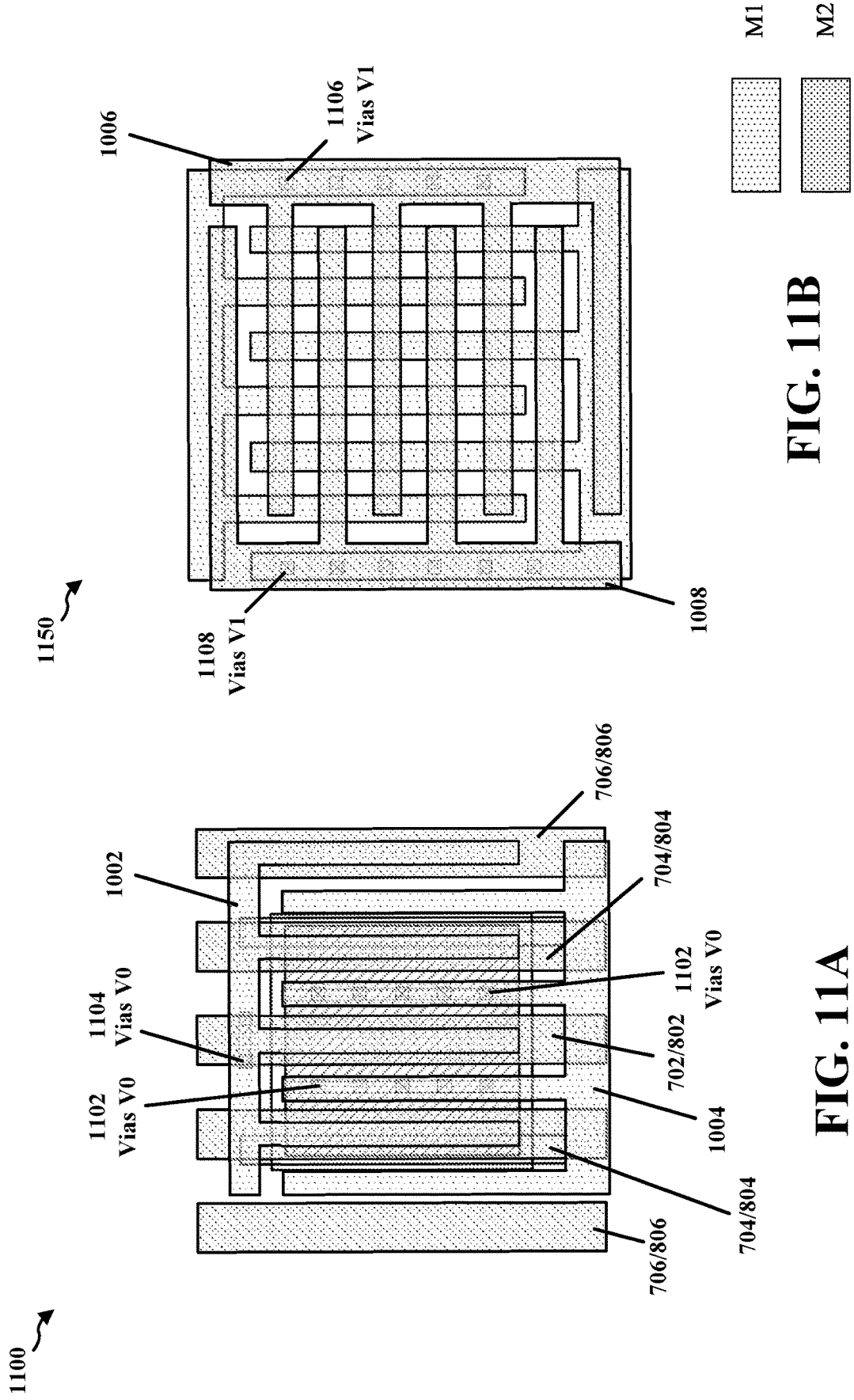
FIG. 11A is a diagram illustrating a top-view of an M1 comb structure in substrate tie cell.
FIG. 11B is a diagram illustrating a top-view of an M2 comb structure overlaid with an M1 comb structure.

FIG. 10 is a diagram 1000 illustrating a top-view of an M1 and M2 comb structure of a substrate tie cell. FIG. 11A is a diagram 1100 illustrating a top-view of an M1 comb structure in substrate tie cell. FIG. 11B is a diagram 1150 illustrating a top-view of an M2 comb structure overlaid with an M1 comb structure. Referring to FIG. 10, the M1 comb structure include M1 combs 1002, 1004. The M2 comb structure includes M2 combs 1006, 1008. Referring to FIG. 11A, the M1 comb structure 1002, 1004 is aligned within a substrate tie cell such that the M1 comb 1002 is coupled to the gate interconnects 702/802 through vias V0 1104, and fingers of the M1 comb 1004 are coupled to the diffusion regions through vias V0 1102. Accordingly, the M1 comb 1004 and the diffusion region are at the same voltage Vdd/Vss, and the M1 comb 1002 and the gate interconnects 702/802 are at the same opposite voltage Vss/Vdd, respectively. Referring to FIG. 11B, the M2 comb 1006 is coupled to the M1 comb 1002 through vias V1 1106, and the M2 comb 1008 is coupled to the M1 comb 1004 through vias V1 1108. Accordingly, the M1 comb 1004, the M2 comb 1008, and the diffusion region are at the same voltage Vdd/Vss, and the M1 comb 1002, the M2 comb 1006, and the gate interconnects 702/802 are at the same opposite voltage Vss/Vdd, respectively.

Figure 12:
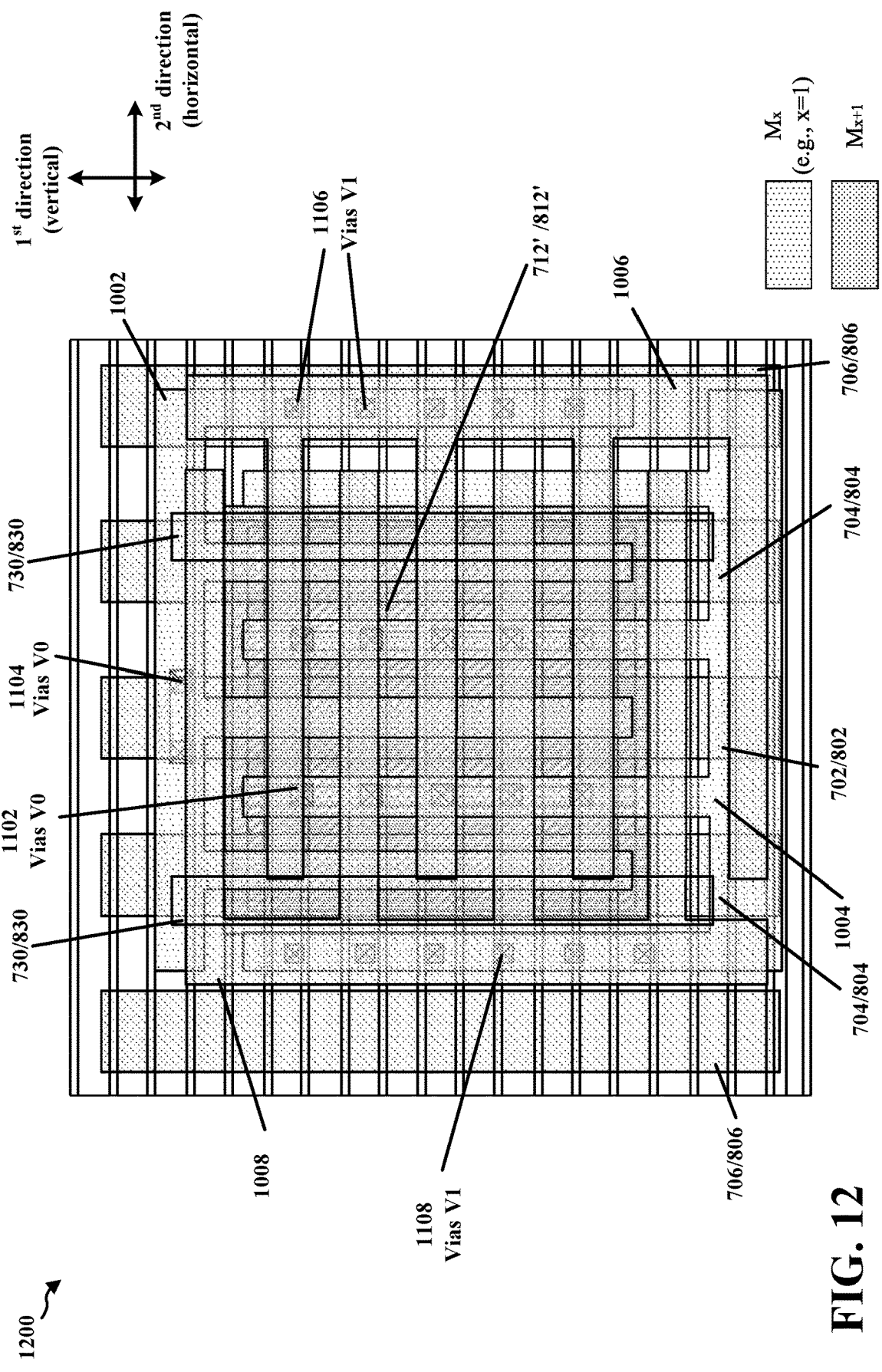
FIG. 12 is a diagram illustrating a top-view of an M2 comb structure overlaid with an M1 comb structure in a p-type substrate tie cell.
Figure 13:
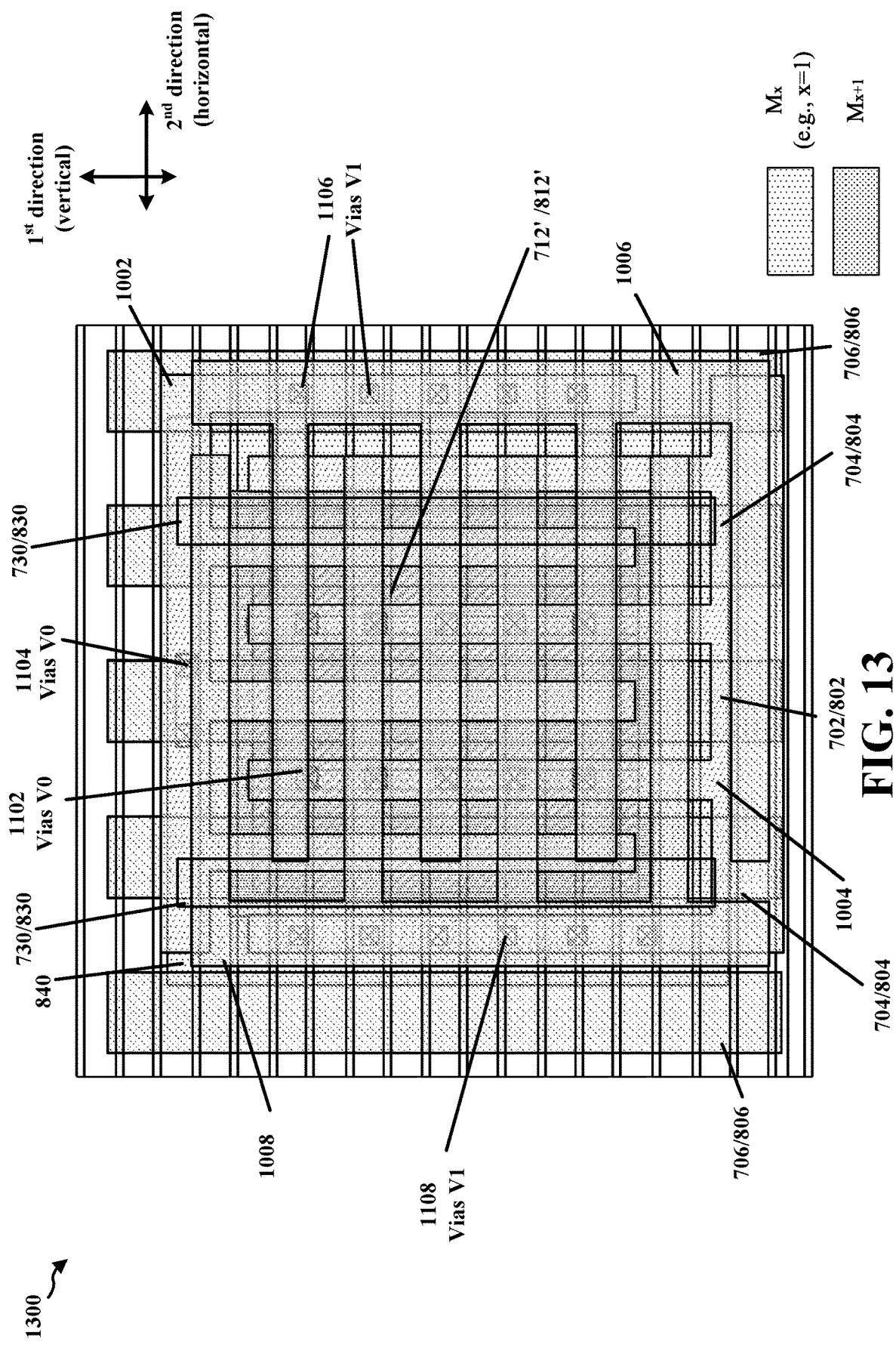
FIG. 13 is a diagram illustrating a top-view of an M2 comb structure overlaid with an M1 comb structure in an n-type substrate tie cell.

FIG. 12 is a diagram 1200 illustrating a top-view of an M2 comb structure overlaid with an M1 comb structure in a substrate tie cell not including a p-type or n-type well (see FIGS. 3, 5). FIG. 13 is a diagram 1300 illustrating a top-view of an M2 comb structure overlaid with an M1 comb structure in a substrate tie cell including a p-type or n-type well (see FIGS. 4, 6). While the comb structure 1002, 1004 has been described as being on the M1 layer and the comb structure 1006, 1008 as being on the M2 layer, the comb structure 1002, 1004 may be on a metal x ($M_x$) layer and the comb structure 1006, 1008 may be on a metal x+1 ($M_{x+1}$) layer. Generally, the substrate tie cell of may include a first set of $M_x$ layer interconnects 1002 on an $M_x$ layer, where the first set of $M_x$ layer interconnects 1002 have a plurality of combs extending over the diffusion region 712'/812'. The first set of $M_x$ layer interconnects 1002 is coupled to the plurality of adjacent gate interconnects 702/802 through vias V0 1104. The substrate tie cell may further include a second set of $M_x$ layer interconnects 1004 on the $M_x$ layer, where the second set of $M_x$ layer interconnects 1004 have a plurality of combs extending over the diffusion region 712'/812'. The second set of $M_x$ layer interconnects 1004 is coupled to the diffusion region 712'/812' through vias V0 1102. The combs of the first set of $M_x$ layer interconnects 1002 are interlaced with combs of the second set of $M_x$ layer interconnects 1004. The combs of the first set of $M_x$ layer interconnects 1002, the second set of $M_x$ layer interconnects 1004, and the gate interconnects 702/802, 704/804, 706/806 extend in the same direction (e.g., first direction, vertically).

The substrate tie cell may further include a first set of $M_{x+1}$ layer interconnects 1006 on an $M_{x+1}$ layer, where the first set of $M_{x+1}$ layer interconnects 1006 have a plurality of combs extending over the diffusion region 712'/812'. The first set of $M_{x+1}$ layer interconnects 1006 is coupled to the first set of $M_x$ layer interconnects 1002 through vias V1 1106. The substrate tie cell may further include a second set of $M_{x+1}$ layer interconnects 1008 on an $M_{x+1}$, where the second set of $M_{x+1}$ layer interconnects 1008 have a plurality of combs extending over the diffusion region 712'/812'. The second set of $M_{x+1}$ layer interconnects 1008 is coupled to the second set of $M_x$ layer interconnects 1004 through vias V1 1108. The combs of the first set of $M_{x+1}$ layer interconnects 1006 are interlaced with combs of the second set of $M_{x+1}$ layer interconnects 1008. The combs of the first set of $M_x$ layer interconnects 1002, the second set of $M_x$ layer interconnects 1004, and the gate interconnects 702/802, 704/804, 706/806 extend in a first direction (e.g., vertically). The combs of the first set of $M_{x+1}$ layer interconnects 1006 and the second set of $M_{x+1}$ layer interconnects 1008 extend in a second direction (e.g., horizontally) orthogonal to the first direction. In one configuration, x=1, where the $M_x$ layer is an M1 layer and the $M_{x+1}$ layer is an M2 layer.

In one configuration, the diffusion region 712'/812' is a p-type diffusion region (see FIGS. 3, 6). In such a configuration, the first set of $M_x$ layer interconnects 1002 and the plurality of adjacent gate interconnects 702/802 are coupled to the first voltage (e.g., a power supply voltage Vdd), and the second set of $M_x$ layer interconnects 1004 and the diffusion region 712'/812' are coupled to the second voltage (e.g., a ground voltage Vss). The p-type diffusion region 712'/812' may be within a p-type substrate 360 (see FIGS. 3, 12), or may be within a p-type well 840, 650 within an n-type substrate 660 (see FIGS. 6, 13).

In one configuration, the diffusion region 712'/812' is an n-type diffusion region (see FIGS. 4, 5). In such a configuration, the first set of $M_x$ layer interconnects 1002 and the plurality of adjacent gate interconnects 702/802 are coupled to the second voltage (e.g., ground voltage Vss), and the second set of $M_x$ layer interconnects 1004 and the diffusion region 712'/812' are coupled to the first voltage (e.g., power supply voltage Vdd). The n-type diffusion region 712'/812' may be within an n-type well 840, 450 within a p-type substrate 460 (see FIGS. 4, 13), or may be within an n-type substrate 560 (see FIGS. 5, 12).

Figure 14:
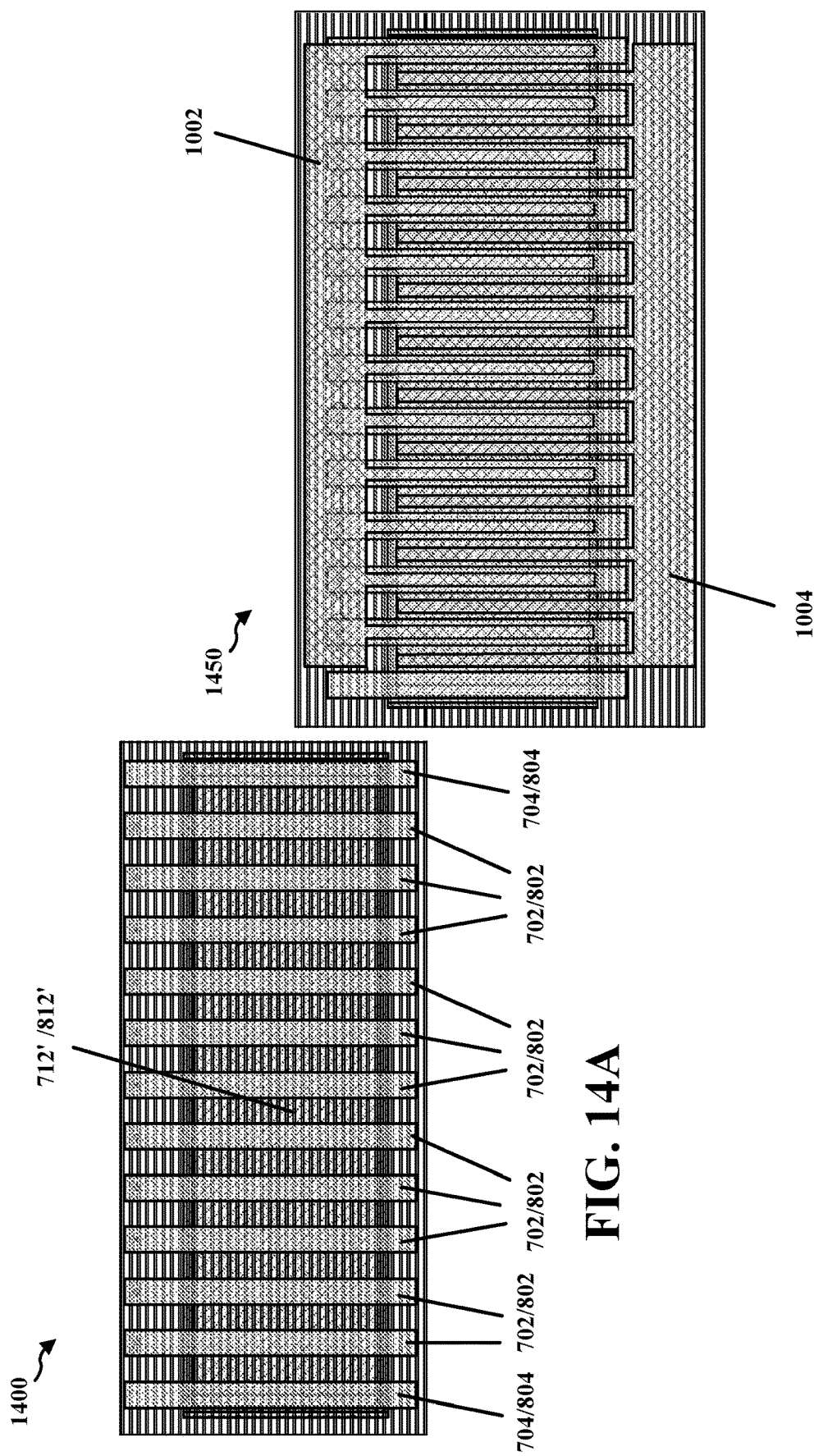
FIG. 14A is a diagram illustrating a top-view of a layout of a first substrate tie cell including layers at and below the gate interconnects.
FIG. 14B is a diagram illustrating a top-view of a layout of the first substrate tie cell including layers at and below the M1 layer.
Figure 15:
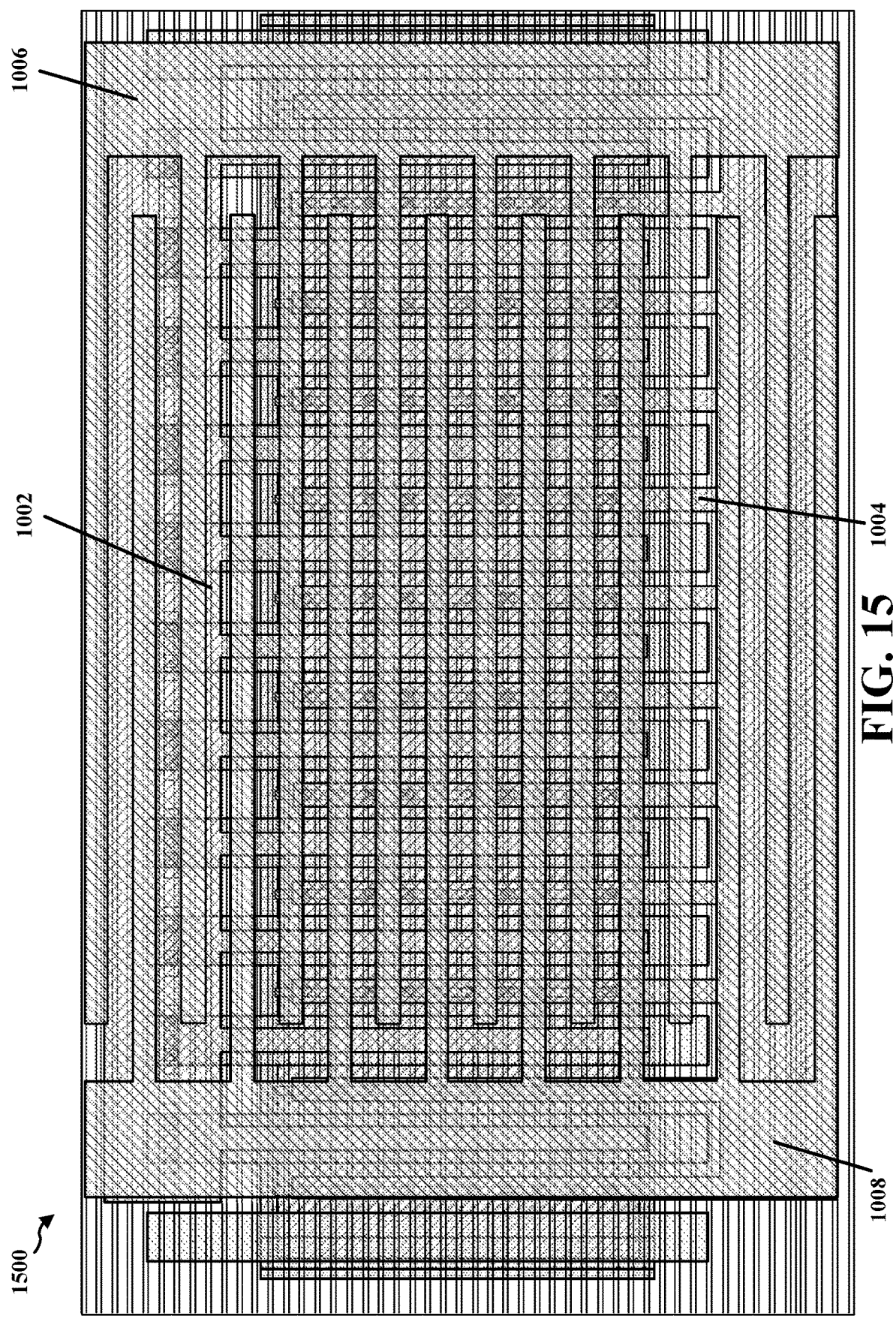
FIG. 15 is a diagram illustrating a top-view of a layout of the first substrate tie cell including layers at and below the M2 layer.

FIG. 14A is a diagram 1400 illustrating a top-view of a layout of a first substrate tie cell including layers at and below the gate interconnects. FIG. 14B is a diagram 1450 illustrating a top-view of a layout of the first substrate tie cell including layers at and below the M1 layer. FIG. 15 is a diagram 1500 illustrating a top-view of a layout of the first substrate tie cell including layers at and below the M2 layer. The first substrate tie cell has a plurality of adjacent gate interconnects 702/802 configured to be coupled to a voltage (illustrated with 11 adjacent gate interconnects 702/802 configured to be coupled to a voltage, where the gate interconnects 704/804 are configured to be floating), a diffusion region 712'/812', M1 comb interconnects 1002, 1004, and M2 comb interconnects 1006, 1008. If the first substrate tie cell is a p-type substrate tie cell on a p-type substrate with a p-type diffusion region 712'/812' (see FIG. 3), then the p-type diffusion region 712'/812' and the comb interconnects 1004, 1008 are coupled together and to a ground voltage Vss, and the plurality of adjacent gate interconnects 702/802 and the comb interconnects 1002, 1006 are coupled together and to a power supply voltage Vdd (see FIG. 3). If the first substrate tie cell is an n-type substrate tie cell on an n-type substrate with an n-type diffusion region 712'/812' (see FIG. 5), then the n-type diffusion region 712'/812' and the comb interconnects 1004, 1008 are coupled together and to a power supply voltage Vdd, and the plurality of adjacent gate interconnects 702/802 and the comb interconnects 1002, 1006 are coupled together and to a ground voltage Vss (see FIG. 5).

Figure 16:
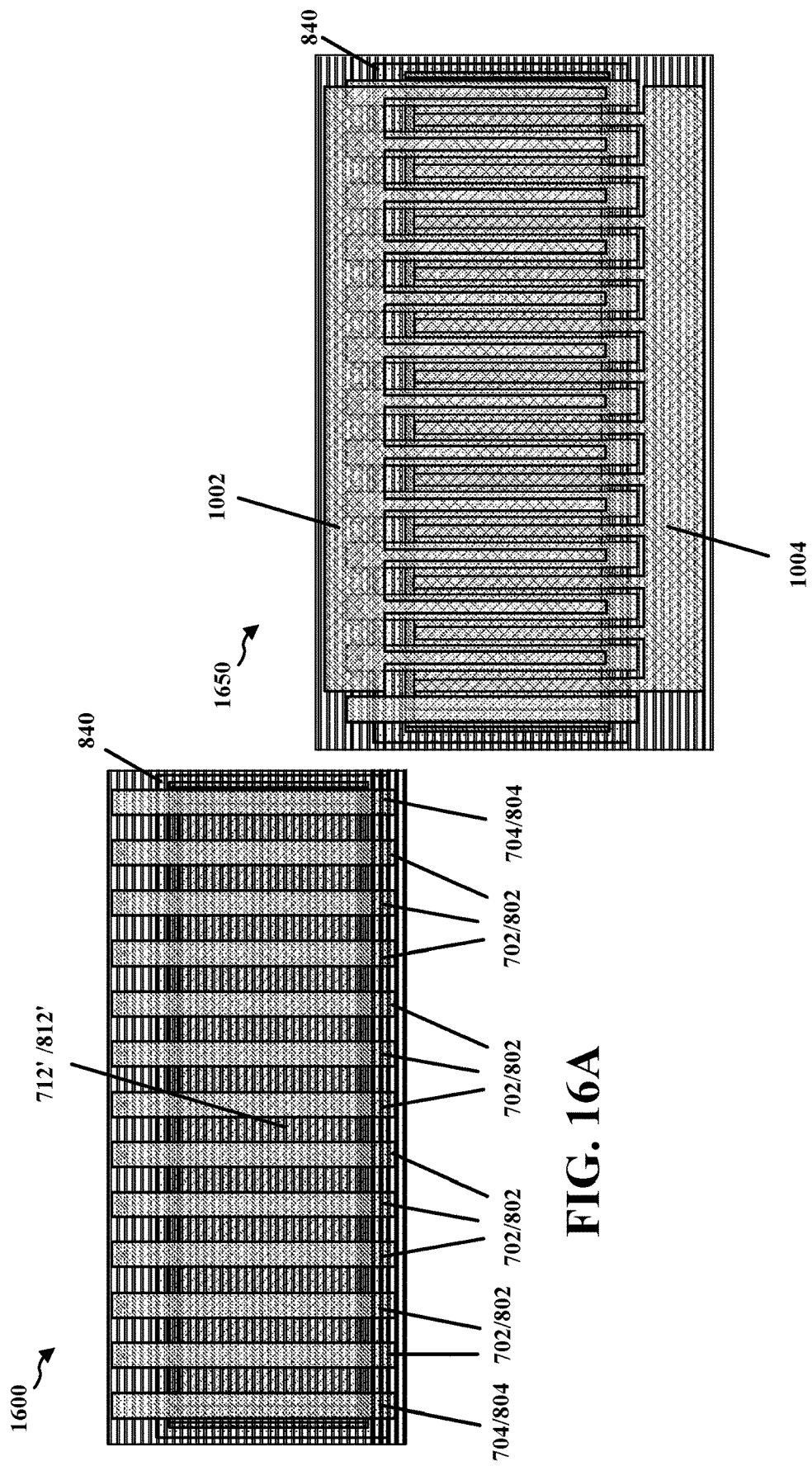
FIG. 16A is a diagram illustrating a top-view of a layout of a second substrate tie cell including layers at and below the gate interconnects.
FIG. 16B is a diagram illustrating a top-view of a layout of a second substrate tie cell including layers at and below the M1 layer.
Figure 17:
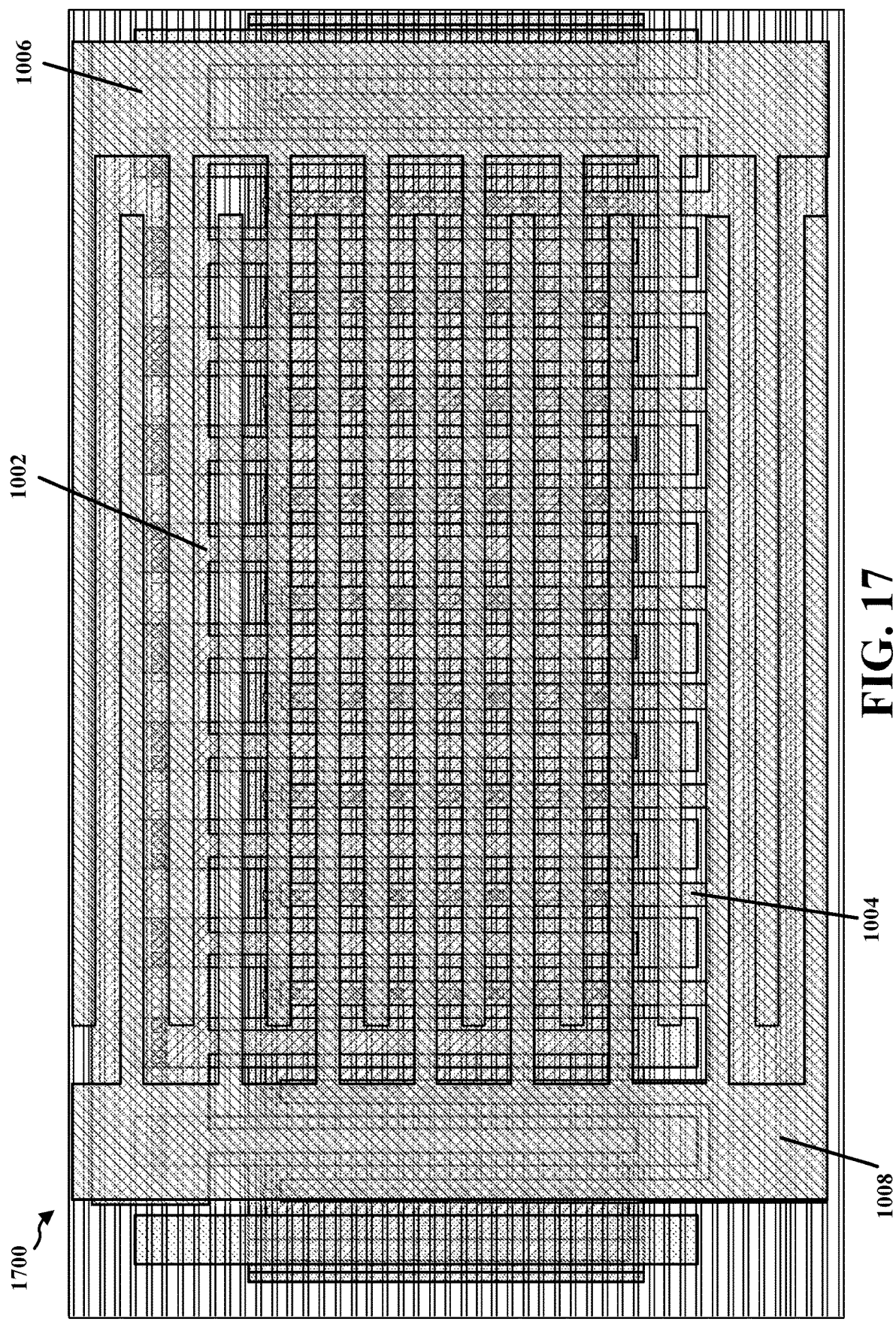
FIG. 17 is a diagram illustrating a top-view of a layout of the second substrate tie cell including layers at and below the M2 layer.

FIG. 16A is a diagram 1600 illustrating a top-view of a layout of a second substrate tie cell including layers at and below the gate interconnects. FIG. 16B is a diagram 1650 illustrating a top-view of a layout of the second substrate tie cell including layers at and below the M1 layer. FIG. 17 is a diagram 1700 illustrating a top-view of a layout of the second substrate tie cell including layers at and below the M2 layer. The second substrate tie cell has a plurality of adjacent gate interconnects 702/802 configured to be coupled to a voltage (illustrated with 11 adjacent gate interconnects 702/802 configured to be coupled to a voltage, where the gate interconnects 704/804 are configured to be floating), a diffusion region 712'/812' within a p-type or n-type well 840, M1 comb interconnects 1002, 1004, and M2 comb interconnects 1006, 1008. If the second substrate tie cell is an n-type substrate tie cell with an n-type diffusion region 712'/812' on an n-type well 450 within a p-type substrate (see FIG. 4), then the n-type diffusion region 712'/812' and the comb interconnects 1004, 1008 are coupled together and to a power supply voltage Vdd, and the plurality of adjacent gate interconnects 702/802 and the comb interconnects 1002, 1006 are coupled together and to a ground voltage Vss (see FIG. 4). If the second substrate tie cell is a p-type substrate tie cell with a p-type diffusion region 712'/812' on a p-type well 650 within an n-type substrate (see FIG. 6), then the p-type diffusion region 712'/812' and the comb interconnects 1004, 1008 are coupled together and to a ground voltage Vss, and the plurality of adjacent gate interconnects 702/802 and the comb interconnects 1002, 1006 are coupled together and to a power supply voltage Vdd (see FIG. 6).

A substrate tie cell with the multilayer comb structure as presented in relation to FIGS. 10, 11A, 11B, 12, 13, 14A, 14B, 15, 16A, 16B, 17, allow the substrate tie cell to provide an even greater decoupling capacitance to the IC in which the substrate tie cell is connected. While the aforedescribed substrate tie cell with the gate interconnect connections to Vdd/Vss and the multilayer comb structure connected to Vdd/Vss may have a slightly increased area as compared to traditional substrate tie cells, the additional decoupling capacitance that the substrate tie cell provides should allow an IC to include fewer decoupling capacitors, and thereby allow for an overall area of the IC to be reduced. Further, a decoupling capacitance can be provided closer to the circuitry that needs the decoupling capacitance, as discussed supra.

The aforedescribed substrate tie cell may be positioned to form one or more guard rings, which can encircle/surround any circuit, device, and/or elements, including an active circuit (e.g., nMOS/pMOS) and/or passive circuit (e.g., resistors, capacitors, inductors). The shape of a guard ring can vary in different implementations, and may have a shape such as, for example, a rectangle, a square, a circle, an oval, or some other shape. Some examples of the guard ring configuration are discussed infra in relation to FIGS. 18-23.

Figure 19:
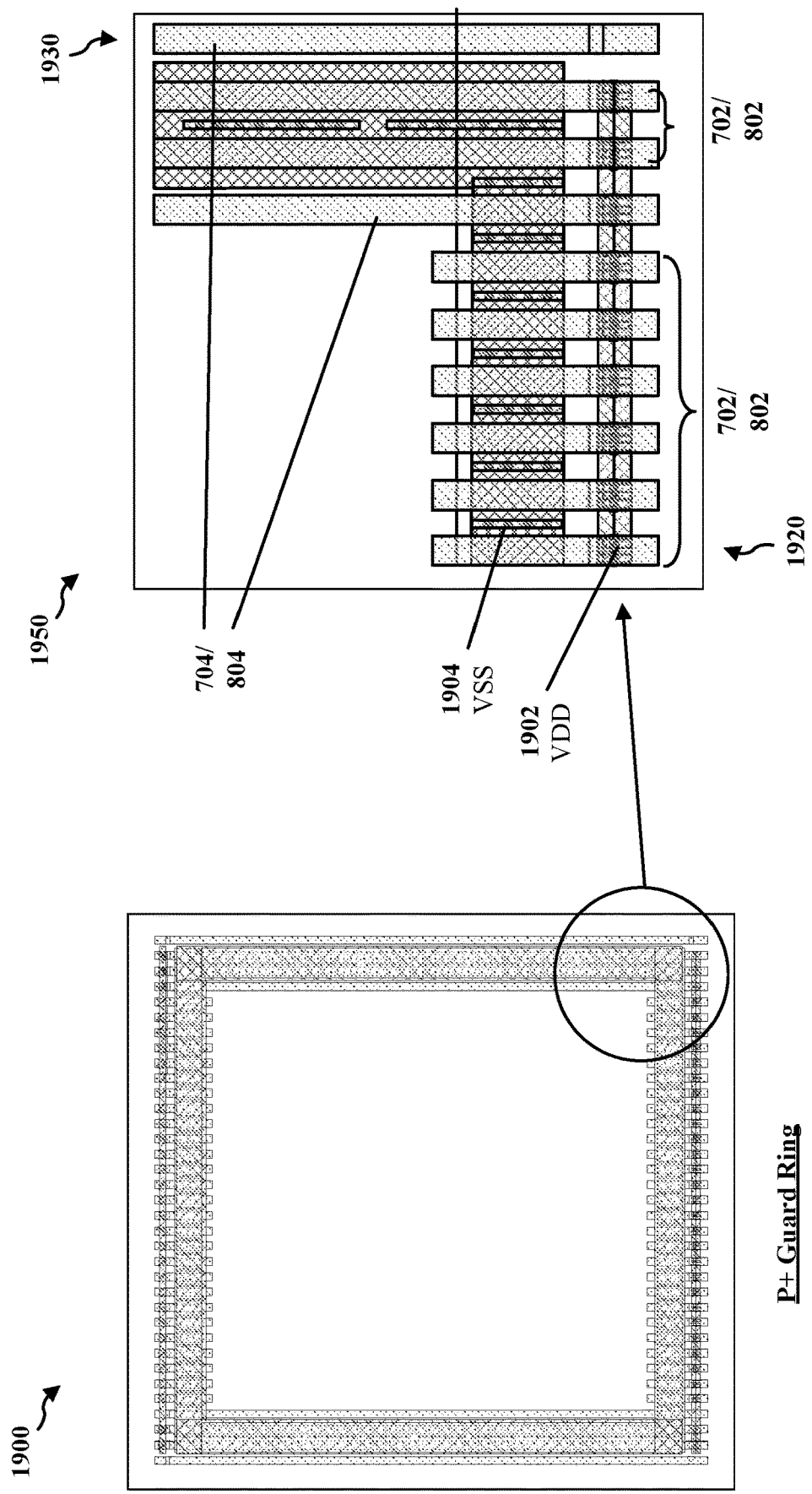
FIG. 19 is a second set of diagrams illustrating a close-up top-view of a layout for a p-type guard ring formed of adjacent p-type substrate tie cells.

FIG. 18 is a first set of diagrams 1800, 1850 illustrating a top-view of a layout for a p-type guard ring formed of adjacent p-type substrate tie cells. FIG. 19 is a second set of diagrams 1900, 1950 illustrating a close-up top-view of a layout for a p-type guard ring formed of adjacent p-type substrate tie cells. In the discussion infra, the substrate is assumed to be a p-type substrate (see FIG. 3); however, the design is also applicable to an N+ guard ring with n-type substrate tie cells forming an n-type guard ring on an n-type substrate (see FIG. 5). The p-type substrate tie cells may be positioned on an IC adjacent to each other to form a P+ guard ring. The P+ guard ring may surround a circuit 1860. Two different p-type substrate tie cells may be used, with a first type of substrate tie cell 1920 located on the bottom and top portions of the guard ring, and a second type of substrate tie cell 1930 located on the left and right portions of the guard ring. The first type of substrate tie cell 1920 may have a width greater than its height. The second type of substrate tie cell 1930 may have a height greater than its width. Accordingly, the first type of substrate tie cell 1920 may have a relatively greater number of gate interconnects coupled to a power supply voltage Vdd. Both the first type of substrate tie cell 1920 and the second type of substrate tie cell 1930 have edge gate interconnects 704/804, one of which may be shared at an edge between the first type of substrate tie cell 1920 and the second type of substrate tie cell 1930. The edge gate interconnects 704/804 are floating. The adjacent gate interconnects 702/802 of the first and second types of p-type substrate tie cells 1920, 1930 may be coupled to the power supply voltage Vdd 1902. The diffusion regions of the first and second types of p-type substrate tie cells 1920, 1930 may be coupled to the ground voltage Vss 1904.

Figure 21:
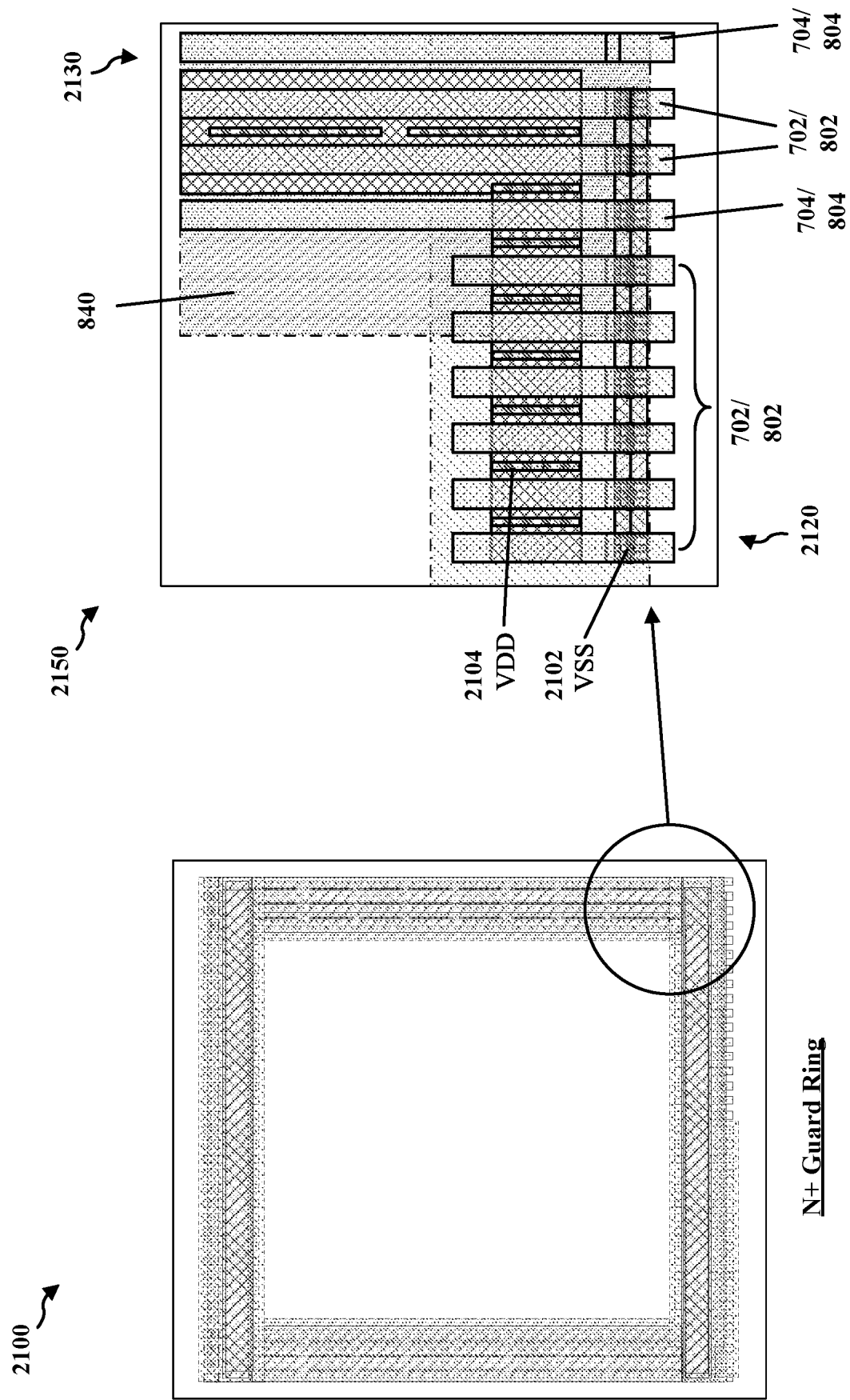
FIG. 21 is a second set of diagrams illustrating a top-view of a layout for an n-type guard ring formed of adjacent n-type substrate tie cells.

FIG. 20 is a first set of diagrams 2000, 2050 illustrating a top-view of a layout for an n-type guard ring formed of adjacent n-type substrate tie cells. FIG. 21 is a second set of diagrams 2100, 2150 illustrating a top-view of a layout for an n-type guard ring formed of adjacent n-type substrate tie cells. In the discussion infra, the substrate is assumed to be a p-type substrate (see FIG. 4); however, the design is also applicable to a P+ guard ring with p-type substrate tie cells forming a p-type guard ring on a p-type well within an n-type substrate (see FIG. 6). The n-type substrate tie cells may be positioned on an IC adjacent to each other to form an N+ guard ring within an n-type well 840. The N+ guard ring may surround a circuit 2060. Two different n-type substrate tie cells may be used, with a first type of substrate tie cell 2120 located on the bottom and top portions of the guard ring, and a second type of substrate tie cell 2130 located on the left and right portions of the guard ring. The first type of substrate tie cell 2120 may have a width greater than its height. The second type of substrate tie cell 2130 may have a height greater than its width. Accordingly, the first type of substrate tie cell 2120 may have a relatively greater number of gate interconnects coupled to a ground voltage Vss. Both the first type of substrate tie cell 2120 and the second type of substrate tie cell 2130 have edge gate interconnects 704/804, one of which may be shared at an edge between the first type of substrate tie cell 2120 and the second type of substrate tie cell 2130. The edge gate interconnects 704/804 are floating. The adjacent gate interconnects 702/802 of the first and second types of p-type substrate tie cells 2120, 2130 may be coupled to the ground voltage Vss 2102. The diffusion regions of the first and second types of p-type substrate tie cells 2120, 2130 may be coupled to the power supply voltage Vdd 2104.

Figure 22:
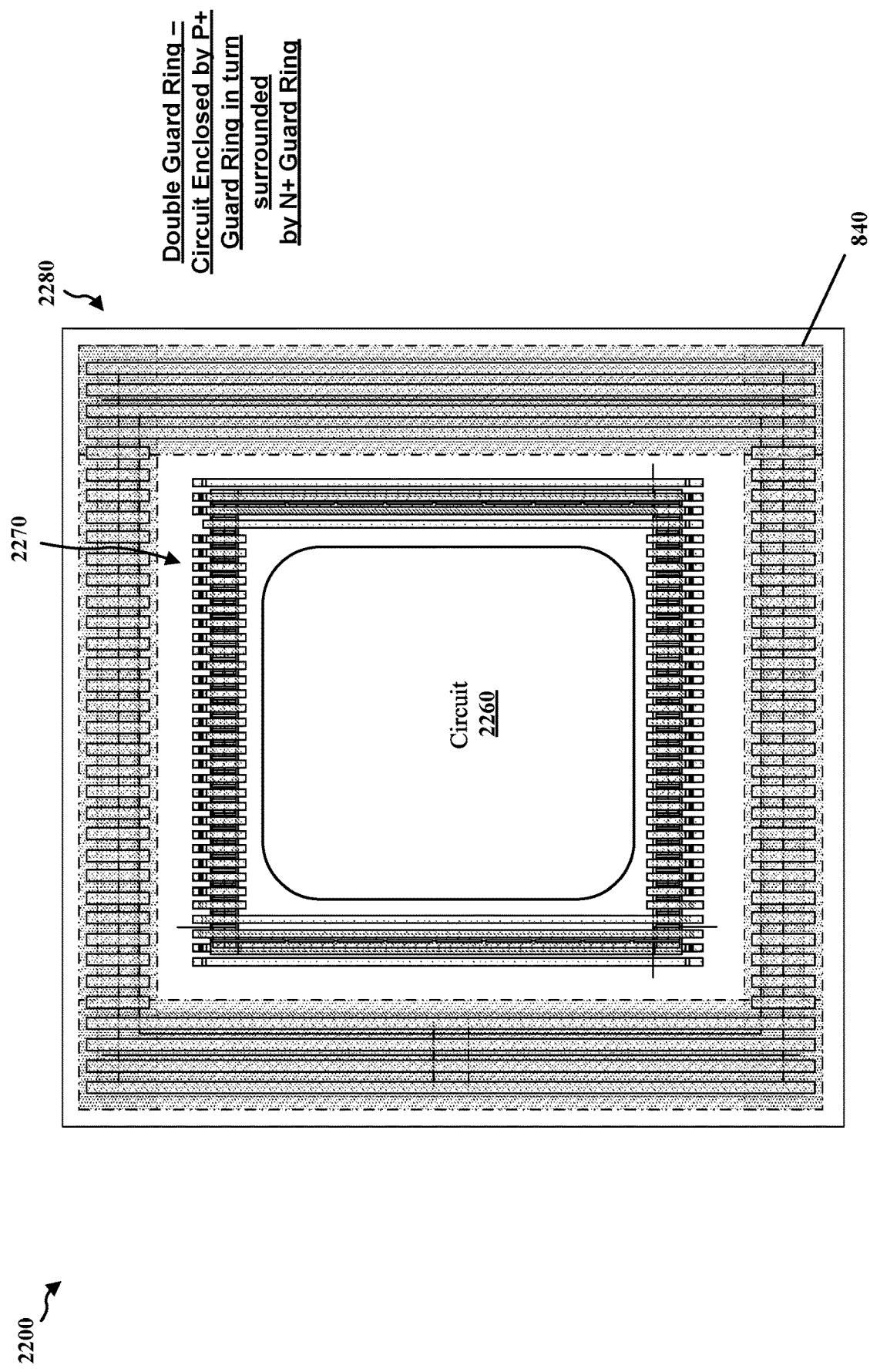
FIG. 22 is a diagram illustrating a top-view of a layout for a double guard ring, with an n-type guard ring surrounding a p-type guard ring.

FIG. 22 is a diagram 2200 illustrating a top-view of a layout for a double guard ring, with an n-type guard ring 2280 surrounding a p-type guard ring 2270. In the discussion infra, the substrate is assumed to be a p-type substrate (see FIGS. 3, 4); however, the design is also applicable when the substrate is an n-type substrate (see FIGS. 5, 6). As illustrated in FIG. 22, a P+ guard ring 2270 formed of p-type substrate tie cells (see FIG. 3) may surround a circuit 2260. An N+ guard ring 2280 formed of n-type substrate tie cells on an n-type well 840 (see FIG. 4) may surround the P+ guard ring 2270.

Figure 23:
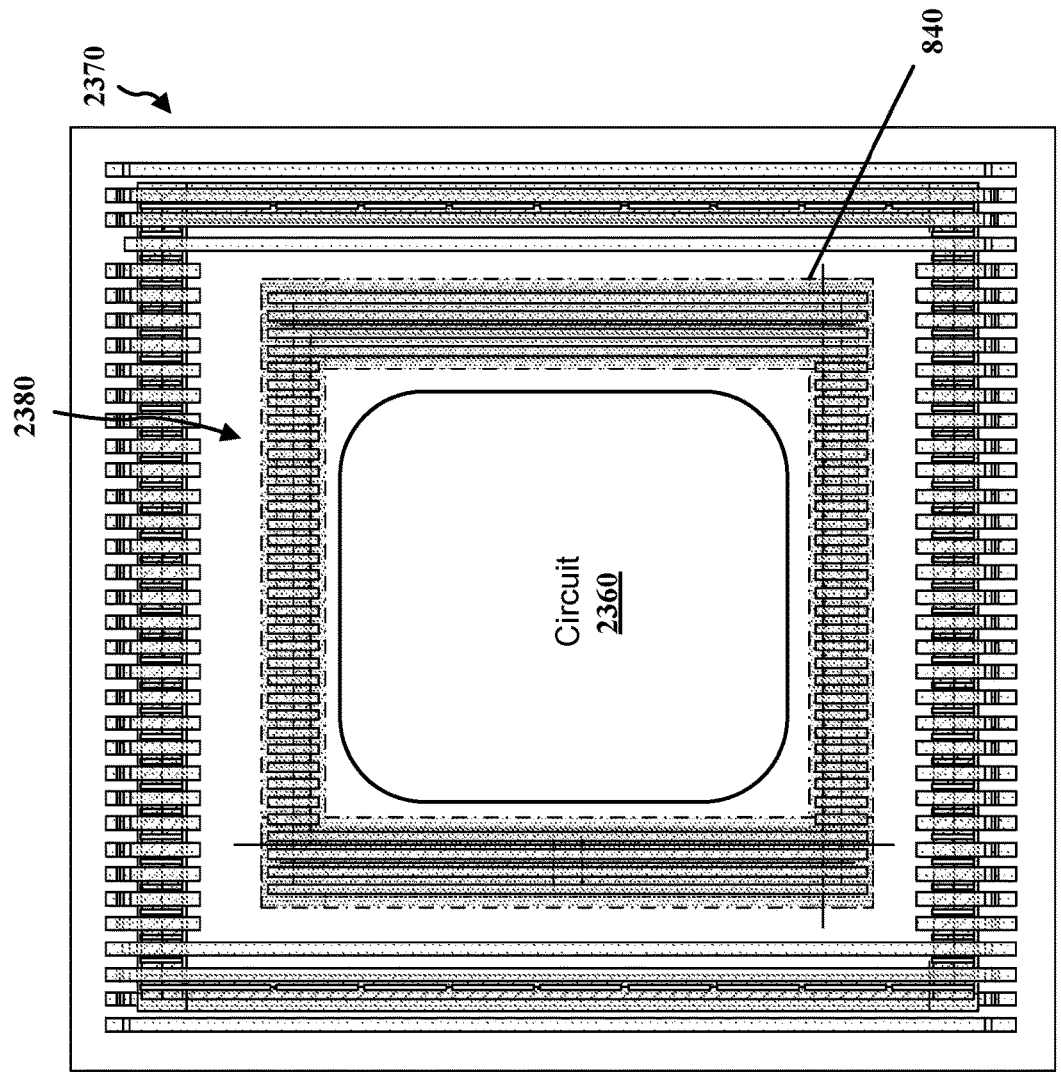
FIG. 23 is a diagram illustrating a top-view of a layout for a double guard ring, with a p-type guard ring surrounding an n-type guard ring.

FIG. 23 is a diagram 2300 illustrating a top-view of a layout for a double guard ring, with a p-type guard ring 2370 surrounding an n-type guard ring 2380. In the discussion infra, the substrate is assumed to be a p-type substrate (see FIGS. 3, 4); however, the design is also applicable when the substrate is an n-type substrate (see FIGS. 5, 6). As illustrated in FIG. 23, an N+ guard ring 2380 formed of n-type substrate tie cells on an n-type well 840 (see FIG. 4) may surround a circuit 2360. A P+ guard ring 2370 formed of p-type substrate tie cells (see FIG. 3) may surround the N+ guard ring 2380.

The guard rings as discussed supra in relation to FIGS. 18-23 may be used to surround critical circuits to protect the critical circuits from external disturbance. The guard rings also provide additional decoupling capacitance to the IC based on the substrate tie cells having gate interconnects tied to a power supply voltage Vdd or a ground voltage Vss, and based on the M1/M2 comb structure, which is connected to the gate interconnects and the diffusion region.

Referring again to FIGS. 3-23, a substrate tie cell on an IC is provided. The substrate tie cell includes a diffusion region 712'/812'. The diffusion region 712'/812' is a p-type diffusion region on or within a p-type substrate 360, as illustrated in FIG. 3; an n-type diffusion region on or within an n-type well 450 within a p-type substrate 460, as illustrated in FIG. 4; an n-type diffusion region on or within an n-type substrate 560, as illustrated in FIG. 5; or a p-type diffusion region on or within a p-type well 650 within an n-type substrate 660, as illustrated in FIG. 6. The substrate tie cell includes a plurality of adjacent gate interconnects 702/802 extending over the diffusion region 712'/812', where the plurality of adjacent gate interconnects includes n gate interconnects and n≥4. The diffusion region 712'/812' may be configured to be at one of a first voltage or a second voltage, and the gate interconnects 702/802 may be configured to be at an other of the first voltage or the second voltage. The first voltage is different than the second voltage.

The substrate tie cell may further include a first set of interconnects 708/808 coupled to the diffusion region 712'/812'. The first set of interconnects 708/808 is configured to provide the one of a first voltage or a second voltage to the diffusion region 712'/812'. The substrate tie cell may further include a second set of interconnects 710/810 coupled to the gate interconnects 702/802. The second set of interconnects 710/810 is configured to provide the other of the first voltage or the second voltage to the gate interconnects 702/802.

In one configuration, as illustrated in FIGS. 3, 6, the diffusion region 712'/812' is a p-type diffusion region, the diffusion region 712'/812' is configured to be at the second voltage, and the gate interconnects 702/802 are configured to be at the first voltage. In one configuration, as illustrated in FIG. 3, the substrate tie cell further includes a p-type substrate 360. The p-type diffusion region 712'/812' is on or within the p-type substrate 360. The diffusion region 712'/812' is configured to tie the p-type substrate 360 to the second voltage and to provide a body connection at the second voltage to nMOS transistors outside the substrate tie cell. In one configuration, as illustrated in FIG. 6, the substrate tie cell further includes a p-type well (p-well) 650. The p-type diffusion region 712'/812' is on or within the p-well 650. The diffusion region 712'/812' is configured to tie the p-well 650 to the second voltage and to provide a body connection at the second voltage to nMOS transistors outside the substrate tie cell. In one configuration, the substrate tie cell further includes an n-type substrate 660, where the p-well 650 is within the n-type substrate 660.

In one configuration, as illustrated in FIGS. 4, 5, the diffusion region 712'/812' is an n-type diffusion region. The diffusion region 712'/812' is configured to be at the first voltage, and the gate interconnects 702/802 are configured to be at the second voltage. In one configuration, as illustrated in FIG. 4, the substrate tie cell further includes an n-type well (n-well) 450. The n-type diffusion region 712'/812' is on or within the n-well 450. The diffusion region 712'/812' is configured to tie the n-well 450 to the first voltage and to provide a body connection at the first voltage to pMOS transistors outside the substrate tie cell. In one configuration, the substrate tie cell further includes a p-type substrate 460, where the n-well 450 is within the p-type substrate 460. In one configuration, as illustrated in FIG. 5, the substrate tie cell further includes an n-type substrate 560. The n-type diffusion region 712'/812' is on or within the n-type substrate 560. The diffusion region 712'/812' is configured to tie the n-type substrate 560 to the first voltage and to provide a body connection at the first voltage to pMOS transistors outside the substrate tie cell.

In one configuration, the first voltage is a power supply voltage Vdd and the second voltage is a ground voltage Vss.

In one configuration, an IC includes a first set of substrate tie cells on the IC. As illustrated in FIGS. 18-23, the first set of substrate tie cells form a first ring on the IC. The substrate tie cells of the first set of substrate tie cells are a first type of substrate tie cell. Each substrate tie cell of the first set of substrate tie cells includes a diffusion region. The diffusion region is a p-type diffusion region on or within a p-type substrate, an n-type diffusion region on or within an n-type well within a p-type substrate, an n-type diffusion region on or within an n-type substrate, or a p-type diffusion region on or within a p-type well within an n-type substrate. Each substrate tie cell of the first set of substrate tie cells further includes at least one gate interconnect extending over the diffusion region. The diffusion region is configured to be at one of a first voltage or a second voltage, and the at least one gate interconnect is configured to be at an other of the first voltage or the second voltage. The first voltage is different than the second voltage.

The at least one gate interconnect may include a plurality of adjacent gate interconnects, where the plurality of adjacent gate interconnects includes n gate interconnects and n≥4. As illustrated in FIGS. 18, 19, 22 (2270), 23 (2370), the diffusion region may be a p-type diffusion region. The diffusion region may be configured to be at the second voltage, and the at least one gate interconnect may be configured to be at the first voltage. As illustrated in FIGS. 20, 21, 22 (2280), 23 (2380), the diffusion region may be an n-type diffusion region. The diffusion region may be configured to be at the first voltage, and the at least one gate interconnect may be configured to be at the second voltage.

Each substrate tie cell within the guard ring may include the $M_x/M_{x+1}$ (e.g., M1/M2) comb structure as discussed supra. Specifically, each substrate tie cell of the first set of substrate tie cells may further include a first set of $M_x$ layer interconnects on an $M_x$ layer having a plurality of combs and extending over the diffusion region. The first set of $M_x$ layer interconnects is coupled to the at least one gate interconnect. Each substrate tie cell of the first set of substrate tie cells may further include a second set of $M_x$ layer interconnects on the $M_x$ layer having a plurality of combs and extending over the diffusion region. The second set of $M_x$ layer interconnects is coupled to the diffusion region. The combs of the first set of $M_x$ layer interconnects are interlaced with combs of the second set of $M_x$ layer interconnects. The combs of the first set of $M_x$ layer interconnects, the second set of $M_x$ layer interconnects, and the at least one gate interconnect extend in the same direction. Each substrate tie cell of the first set of substrate tie cells may further include a first set of $M_{x+1}$ layer interconnects on an $M_{x+1}$ layer having a plurality of combs and extending over the diffusion region. The first set of $M_{x+1}$ layer interconnects is coupled to the first set of $M_x$ layer interconnects. Each substrate tie cell of the first set of substrate tie cells may further include a second set of $M_{x+1}$ layer interconnects on an $M_{x+1}$ having a plurality of combs and extending over the diffusion region. The second set of $M_{x+1}$ layer interconnects is coupled to the second set of $M_x$ layer interconnects. The combs of the first set of $M_{x+1}$ layer interconnects are interlaced with combs of the second set of $M_{x+1}$ layer interconnects. The combs of the first set of $M_x$ layer interconnects, the second set of $M_x$ layer interconnects, and the at least one gate interconnect extend in a first direction. The combs of the first set of $M_{x+1}$ layer interconnects and the second set of $M_{x+1}$ layer interconnects extend in a second direction orthogonal to the first direction. In one example, x=1, where the $M_x$ layer is an M1 layer and the $M_{x+1}$ layer is an M2 layer. In one configuration, the diffusion region is a p-type diffusion region, the first set of $M_x$ layer interconnects and the at least one gate interconnect are coupled to the first voltage, and the second set of $M_x$ layer interconnects and the diffusion region are coupled to the second voltage. In another configuration, the diffusion region is an n-type diffusion region, the first set of $M_x$ layer interconnects and the at least one gate interconnect are coupled to the second voltage, and the second set of $M_x$ layer interconnects and the diffusion region are coupled to the first voltage.

In one configuration, as illustrated in FIGS. 22, 23, the IC further includes a second set of substrate tie cells on the IC. The second set of substrate tie cells form a second ring (2270, FIG. 22; 2380, FIG. 23) within the first ring on the IC (where the first ring here is 2280, FIG. 22 or 2370, FIG. 23).

Substrate tie cells of the second set of substrate tie cells are a second type of substrate tie cell different than the first type of substrate tie cell. Each substrate tie cell of the second set of substrate tie cells includes a diffusion region. The diffusion region is a p-type diffusion region on or within a p-type substrate, an n-type diffusion region on or within an n-type well within a p-type substrate, an n-type diffusion region on or within an n-type substrate, or a p-type diffusion region on or within a p-type well within an n-type substrate. Each substrate tie cell of the second set of substrate tie cells further includes at least one gate interconnect extending over the diffusion region. The diffusion region is configured to be at one of the first voltage or the second voltage, and the at least one gate interconnect is configured to be at an other of the first voltage or the second voltage.

In one example, as illustrated in FIG. 23, for the first type of substrate tie cell, the diffusion region is a p-type diffusion region, the diffusion region is configured to be at the second voltage, and the at least one gate interconnect is configured to be at the first voltage (ring 2370 of FIG. 23), and for the second type of substrate tie cell, the diffusion region is an n-type diffusion region, the diffusion region is configured to be at the first voltage, and the at least one gate interconnect is configured to be at the second voltage (ring 2380 of FIG. 23).

In another example, as illustrated in FIG. 22, for the second type of substrate tie cell, the diffusion region is a p-type diffusion region, the diffusion region is configured to be at the second voltage, and the at least one gate interconnect is configured to be at the first voltage (ring 2270 of FIG. 22), and for the first type of substrate tie cell, the diffusion region is an n-type diffusion region, the diffusion region is configured to be at the first voltage, and the at least one gate interconnect is configured to be at the second voltage (ring 2280 of FIG. 22).

In one configuration, the first voltage is a power supply voltage Vdd and the second voltage is a ground voltage Vss.

A substrate tie cell ties the substrate or well of an IC to a power supply voltage or a ground voltage. The substrate tie cell ties some gate interconnects that would be floating to a voltage opposite a voltage at the diffusion region. In addition, the substrate tie cell includes an $M_x/M_{x+1}$ (e.g., M1/M2) comb structure connected to both the diffusion region and the gate interconnects that are tied to a voltage (not floating). The layout with the plurality of gate interconnects and comb structure provides the substrate tie cell with an additional decoupling capacitance. While such cell may have a slightly increased area, the additional decoupling capacitance that the cells provide allow an IC to be designed with less decoupling capacitors, thereby reducing an overall area of an IC. Further, the decoupling capacitance may be located closer to circuitry that needs to utilize the decoupling capacitance (e.g., to address high frequency noise and/or dynamic IR drop). Such substrate tie cells may be arranged into one or more rings to surround critical circuits to thereby protect the critical circuits from external disturbance.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other embodiments or teachings described herein, without limitation.

Example 1 is a substrate tie cell on an IC. The substrate tie cell includes a diffusion region. The diffusion region is a p-type diffusion region on or within a p-type substrate, an n-type diffusion region on or within an n-type well within a p-type substrate, an n-type diffusion region on or within an n-type substrate, or a p-type diffusion region on or within a p-type well within an n-type substrate. The substrate tie cell further includes a plurality of adjacent gate interconnects extending over the diffusion region, the plurality of adjacent gate interconnects including n gate interconnects, where n≥4. The diffusion region is configured to be at one of a first voltage or a second voltage, and the gate interconnects are configured to be at an other of the first voltage or the second voltage, the first voltage being different than the second voltage.

Example 2 is the substrate tie cell of example 1, further including a first set of interconnects coupled to the diffusion region. The first set of interconnects is configured to provide the one of a first voltage or a second voltage to the diffusion region. The substrate tie cell further includes a second set of interconnects coupled to the gate interconnects. The second set of interconnects is configured to provide the other of the first voltage or the second voltage to the gate interconnects.

Example 3 is the substrate tie cell of any of Examples 1 and 2, wherein the diffusion region is a p-type diffusion region, the diffusion region is configured to be at the second voltage, and the gate interconnects are configured to be at the first voltage.

Example 4 is the substrate tie cell of Example 3, further including a p-type substrate. The p-type diffusion region is on or within the p-type substrate. The diffusion region is configured to tie the p-type substrate to the second voltage and to provide a body connection at the second voltage to nMOS transistors outside the substrate tie cell.

Example 5 is the substrate tie cell of Example 3, further including a p-type well (p-well). The p-type diffusion region is on or within the p-well. The diffusion region is configured to tie the p-well to the second voltage and to provide a body connection at the second voltage to nMOS transistors outside the substrate tie cell.

Example 6 is the substrate tie cell of Example 5, further including an n-type substrate. The p-well is within the n-type substrate.

Example 7 is the substrate tie cell of any of Examples 1 and 2, wherein the diffusion region is an n-type diffusion region. The diffusion region is configured to be at the first voltage, and the gate interconnects are configured to be at the second voltage.

Example 8 is the substrate tie cell of Example 7, further including an n-type well (n-well). The n-type diffusion region is on or within the n-well. The diffusion region is configured to tie the n-well to the first voltage and to provide a body connection at the first voltage to pMOS transistors outside the substrate tie cell.

Example 9 is the substrate tie cell of Example 8, further including a p-type substrate. The n-well is within the p-type substrate.

Example 10 is the substrate tie cell of Example 7, further including an n-type substrate. The n-type diffusion region is on or within the n-type substrate. The diffusion region is configured to tie the n-type substrate to the first voltage and to provide a body connection at the first voltage to pMOS transistors outside the substrate tie cell.

Example 11 is the substrate tie cell of any of Examples 1 to 10, further including a first set of $M_x$ layer interconnects on an $M_x$ layer having a first plurality of combs and extending over the diffusion region. The first set of $M_x$ layer interconnects is coupled to the plurality of adjacent gate interconnects. The substrate tie cell further includes a second set of $M_x$ layer interconnects on the $M_x$ layer having a second plurality of combs and extending over the diffusion region. The second set of $M_x$ layer interconnects is coupled to the diffusion region. The combs of the first set of $M_x$ layer interconnects are interlaced with combs of the second set of $M_x$ layer interconnects.

Example 12 is the substrate tie cell of Example 11, wherein the combs of the first set of $M_x$ layer interconnects, the second set of $M_x$ layer interconnects, and the gate interconnects extend in a same direction.

Example 13 is the substrate tie cell of Example 11, further including a first set of $M_{x+1}$ layer interconnects on an $M_{x+1}$ layer having a third plurality of combs and extending over the diffusion region. The first set of $M_{x+1}$ layer interconnects is coupled to the first set of $M_x$ layer interconnects. The substrate tie cell further includes a second set of $M_{x+1}$ layer interconnects on an $M_{x+1}$ having a fourth plurality of combs and extending over the diffusion region. The second set of $M_{x+1}$ layer interconnects is coupled to the second set of $M_x$ layer interconnects. The combs of the first set of $M_{x+1}$ layer interconnects are interlaced with combs of the second set of $M_{x+1}$ layer interconnects.

Example 14 is the substrate tie cell of Example 13, wherein the combs of the first set of $M_x$ layer interconnects, the second set of $M_x$ layer interconnects, and the gate interconnects extend in a first direction; and the combs of the first set of $M_{x+1}$ layer interconnects and the second set of $M_{x+1}$ layer interconnects extend in a second direction orthogonal to the first direction.

Example 15 is the substrate tie cell of any of Examples 11 to 14, wherein x=1 and the $M_x$ layer is an M1 layer.

Example 16 is the substrate tie cell of any of Examples 11 to 15, wherein the diffusion region is a p-type diffusion region; the first set of $M_x$ layer interconnects and the plurality of adjacent gate interconnects are coupled to the first voltage; and the second set of $M_x$ layer interconnects and the diffusion region are coupled to the second voltage.

Example 17 is the substrate tie cell of any of Example 11 to 15, wherein the diffusion region is an n-type diffusion region; the first set of $M_x$ layer interconnects and the plurality of adjacent gate interconnects are coupled to the second voltage; and the second set of $M_x$ layer interconnects and the diffusion region are coupled to the first voltage.

Example 18 is an IC. The IC includes a first set of substrate tie cells on the IC. The first set of substrate tie cells form a first ring on the IC. Substrate tie cells of the first set of substrate tie cells are a first type of substrate tie cell. Each substrate tie cell of the first set of substrate tie cells includes a diffusion region. The diffusion region is a p-type diffusion region on or within a p-type substrate, an n-type diffusion region on or within an n-type well within a p-type substrate, an n-type diffusion region on or within an n-type substrate, or a p-type diffusion region on or within a p-type well within an n-type substrate. The substrate tie cell further includes at least one gate interconnect extending over the diffusion region. The diffusion region is configured to be at one of a first voltage or a second voltage, and the at least one gate interconnect is configured to be at an other of the first voltage or the second voltage, the first voltage being different than the second voltage.

Example 19 is the IC of Example 18, wherein the at least one gate interconnect includes a plurality of adjacent gate interconnects, the plurality of adjacent gate interconnects including n gate interconnects, where n≥4.

Example 20 is the IC of any of Examples 18 and 19, wherein the diffusion region is a p-type diffusion region. The diffusion region is configured to be at the second voltage, and the at least one gate interconnect is configured to be at the first voltage.

Example 21 is the IC of any of Examples 18 and 19, wherein the diffusion region is an n-type diffusion region. The diffusion region is configured to be at the first voltage, and the at least one gate interconnect is configured to be at the second voltage.

Example 22 is the IC of any of Examples 18 to 21, wherein each substrate tie cell of the first set of substrate tie cells further includes a first set of $M_x$ layer interconnects and a second set of $M_x$ layer interconnects. The first set of $M_x$ layer interconnects is on an $M_x$ layer and has a first plurality of combs extending over the diffusion region. The first set of $M_x$ layer interconnects is coupled to the at least one gate interconnect. The second set of $M_x$ layer interconnects is on the $M_x$ layer and has a second plurality of combs extending over the diffusion region. The second set of $M_x$ layer interconnects is coupled to the diffusion region. The combs of the first set of $M_x$ layer interconnects are interlaced with combs of the second set of $M_x$ layer interconnects.

Example 23 is the IC of Example 22, wherein the combs of the first set of $M_x$ layer interconnects, the second set of $M_x$ layer interconnects, and the at least one gate interconnect extend in a same direction.

Example 24 is the IC of any of Examples 22 and 23, wherein each substrate tie cell of the first set of substrate tie cells further includes a first set of $M_{x+1}$ layer interconnects and a second set of $M_{x+1}$ layer interconnects. The first set of $M_{x+1}$ layer interconnects is on an $M_{x+1}$ layer and has a third plurality of combs extending over the diffusion region. The first set of $M_{x+1}$ layer interconnects is coupled to the first set of $M_x$ layer interconnects. The second set of $M_{x+1}$ layer interconnects is on an $M_{x+1}$ and has a fourth plurality of combs extending over the diffusion region. The second set of $M_{x+1}$ layer interconnects is coupled to the second set of $M_x$ layer interconnects. The combs of the first set of $M_{x+1}$ layer interconnects are interlaced with combs of the second set of $M_{x+1}$ layer interconnects.

Example 25 is the IC of Example 24, wherein the combs of the first set of $M_x$ layer interconnects, the second set of $M_x$ layer interconnects, and the at least one gate interconnect extend in a first direction; and the combs of the first set of $M_{x+1}$ layer interconnects and the second set of $M_{x+1}$ layer interconnects extend in a second direction orthogonal to the first direction.

Example 26 is the IC of any of Examples 22 to 25, wherein x=1 and the $M_x$ layer is an M1 layer.

Example 27 is the IC of any of Examples 22 to 26, wherein the diffusion region is a p-type diffusion region, the first set of $M_x$ layer interconnects and the at least one gate interconnect are coupled to the first voltage, and the second set of $M_x$ layer interconnects and the diffusion region are coupled to the second voltage; or the diffusion region is an n-type diffusion region, the first set of $M_x$ layer interconnects and the at least one gate interconnect are coupled to the second voltage, and the second set of $M_x$ layer interconnects and the diffusion region are coupled to the first voltage.

Example 28 is the IC of any of Examples 18 to 27, further including a second set of substrate tie cells on the IC. The second set of substrate tie cells form a second ring within the first ring on the IC. Substrate tie cells of the second set of substrate tie cells are a second type of substrate tie cell different than the first type of substrate tie cell. Each substrate tie cell of the second set of substrate tie cells includes a diffusion region. The diffusion region is a p-type diffusion region on or within a p-type substrate, an n-type diffusion region on or within an n-type well within a p-type substrate, an n-type diffusion region on or within an n-type substrate, or a p-type diffusion region on or within a p-type well within an n-type substrate. Each substrate tie cell of the second set of substrate tie cells further includes at least one gate interconnect extending over the diffusion region. The diffusion region is configured to be at one of the first voltage or the second voltage, and the at least one gate interconnect is configured to be at an other of the first voltage or the second voltage.

Example 29 is the IC of Example 28, wherein for the first type of substrate tie cell, the diffusion region is a p-type diffusion region, the diffusion region is configured to be at the second voltage, and the at least one gate interconnect is configured to be at the first voltage, and for the second type of substrate tie cell, the diffusion region is an n-type diffusion region, the diffusion region is configured to be at the first voltage, and the at least one gate interconnect is configured to be at the second voltage.

Example 30 is the IC of Example 28, wherein for the second type of substrate tie cell, the diffusion region is a p-type diffusion region, the diffusion region is configured to be at the second voltage, and the at least one gate interconnect is configured to be at the first voltage, and for the first type of substrate tie cell, the diffusion region is an n-type diffusion region, the diffusion region is configured to be at the first voltage, and the at least one gate interconnect is configured to be at the second voltage.

What is claimed is:

1. A substrate tie cell in an integrated circuit (IC), comprising:
a diffusion region, the diffusion region being a p-type diffusion region on or within a bulk p-type substrate, or an n-type diffusion region on or within an n-type well within a bulk p-type substrate, or an n-type diffusion region on or within a bulk n-type substrate, or a p-type diffusion region on or within a p-type well within a bulk n-type substrate, the diffusion region being configured to tie the bulk p-type substrate, the n-type well, the bulk n-type substrate, or the p-type well to one of a first voltage or a second voltage; and
a plurality of adjacent gate interconnects extending over the diffusion region, the plurality of adjacent gate interconnects including n gate interconnects, where n≥4;
wherein the diffusion region is configured to be at one of the first voltage or the second voltage, and the gate interconnects are configured to be at an other of the first voltage or the second voltage, the first voltage being different than the second voltage.

2. The substrate tie cell of claim 1, further comprising:
a first set of interconnects coupled to the diffusion region, the first set of interconnects being configured to provide the one of a first voltage or a second voltage to the diffusion region; and
a second set of interconnects coupled to the gate interconnects, the second set of interconnects being configured to provide the other of the first voltage or the second voltage to the gate interconnects.

3. The substrate tie cell of claim 1, wherein the diffusion region is the p-type diffusion region, the diffusion region is configured to be at the second voltage, and the gate interconnects are configured to be at the first voltage.

4. The substrate tie cell of claim 3, further comprising the p-type substrate, wherein the p-type diffusion region is on or within the p-type substrate, wherein the diffusion region is configured to tie the p-type substrate to the second voltage and to provide a body connection at the second voltage to n-type MOS (nMOS) transistors outside the substrate tie cell.

5. The substrate tie cell of claim 3, further comprising the p-type well (p-well), wherein the p-type diffusion region is on or within the p-well, wherein the diffusion region is configured to tie the p-well to the second voltage and to provide a body connection at the second voltage to n-type MOS (nMOS) transistors outside the substrate tie cell.

6. The substrate tie cell of claim 5, further comprising the n-type substrate, wherein the p-well is within the n-type substrate.

7. The substrate tie cell of claim 1, wherein the diffusion region is the n-type diffusion region, the diffusion region is configured to be at the first voltage, and the gate interconnects are configured to be at the second voltage.

8. The substrate tie cell of claim 7, further comprising the n-type well (n-well), wherein the n-type diffusion region is on or within the n-well, wherein the diffusion region is configured to tie the n-well to the first voltage and to provide a body connection at the first voltage to p-type MOS (pMOS) transistors outside the substrate tie cell.

9. The substrate tie cell of claim 8, further comprising the p-type substrate, wherein the n-well is within the p-type substrate.

10. The substrate tie cell of claim 7, further comprising the n-type substrate, wherein the n-type diffusion region is on or within the n-type substrate, wherein the diffusion region is configured to tie the n-type substrate to the first voltage and to provide a body connection at the first voltage to p-type MOS (pMOS) transistors outside the substrate tie cell.

11. The substrate tie cell of claim 1, further comprising:
a first set of metal x ($M_x$) layer interconnects on an $M_x$ layer having a first plurality of combs and extending over the diffusion region, the first set of $M_x$ layer interconnects being coupled to the plurality of adjacent gate interconnects; and
a second set of $M_x$ layer interconnects on the $M_x$ layer having a second plurality of combs and extending over the diffusion region, the second set of $M_x$ layer interconnects being coupled to the diffusion region,
wherein the combs of the first set of $M_x$ layer interconnects are interlaced with combs of the second set of $M_x$ layer interconnects.

12. The substrate tie cell of claim 11, wherein the combs of the first set of $M_x$ layer interconnects, the second set of $M_x$ layer interconnects, and the gate interconnects extend in a same direction.

13. The substrate tie cell of claim 11, further comprising:
a first set of metal x+1 ($M_{x+1}$) layer interconnects on an $M_{x+1}$ layer having a third plurality of combs and extending over the diffusion region, the first set of $M_{x+1}$ layer interconnects being coupled to the first set of $M_x$ layer interconnects; and
a second set of $M_{x+1}$ layer interconnects on an $M_{x+1}$ having a fourth plurality of combs and extending over the diffusion region, the second set of $M_{x+1}$ layer interconnects being coupled to the second set of $M_x$ layer interconnects,
wherein the combs of the first set of $M_{x+1}$ layer interconnects are interlaced with combs of the second set of $M_{x+1}$ layer interconnects.

14. The substrate tie cell of claim 13, wherein:
the combs of the first set of $M_x$ layer interconnects, the second set of $M_x$ layer interconnects, and the gate interconnects extend in a first direction; and
the combs of the first set of $M_{x+1}$ layer interconnects and the second set of $M_{x+1}$ layer interconnects extend in a second direction orthogonal to the first direction.

15. The substrate tie cell of claim 11, wherein x=1 and the $M_x$ layer is an M1 layer.

16. The substrate tie cell of claim 11, wherein:
the diffusion region is the p-type diffusion region;
the first set of $M_x$ layer interconnects and the plurality of adjacent gate interconnects are coupled to the first voltage; and
the second set of $M_x$ layer interconnects and the diffusion region are coupled to the second voltage.

17. The substrate tie cell of claim 11, wherein:
the diffusion region is the n-type diffusion region;
the first set of $M_x$ layer interconnects and the plurality of adjacent gate interconnects are coupled to the second voltage; and
the second set of $M_x$ layer interconnects and the diffusion region are coupled to the first voltage.

18. The substrate tie cell of claim 1, wherein:
the first voltage is a supply voltage and the second voltage is a ground voltage,
the diffusion region is configured to be at the second voltage and the gate interconnects are configured to be at the first voltage when the diffusion region is the p-type diffusion region, and
the diffusion region is configured to be at the first voltage and the gate interconnects are configured to be at the second voltage when the diffusion region is the n-type diffusion region.

* * * * *